(12) United States Patent
Wu et al.

(10) Patent No.: US 11,942,420 B2
(45) Date of Patent: Mar. 26, 2024

(54) SEMICONDUCTOR DEVICE INCLUDING RECESSED INTERCONNECT STRUCTURE

(71) Applicant: Taiwan Semiconductor Manufacturing Company, Ltd., Hsinchu (TW)

(72) Inventors: Guo-Huei Wu, Tainan (TW); Hui-Zhong Zhuang, Kaohsiung (TW); Chih-Liang Chen, Hsinchu (TW); Cheng-Chi Chuang, New Taipei (TW); Shang-Wen Chang, Jhubei (TW); Yi-Hsun Chiu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/835,281

(22) Filed: Jun. 8, 2022

(65) Prior Publication Data
US 2022/0302026 A1    Sep. 22, 2022

Related U.S. Application Data

(62) Division of application No. 16/803,497, filed on Feb. 27, 2020, now Pat. No. 11,444,018.

(51) Int. Cl.
*H01L 21/76* (2006.01)
*H01L 21/768* (2006.01)
(Continued)

(52) U.S. Cl.
CPC .... *H01L 23/5226* (2013.01); *H01L 21/76816* (2013.01); *H01L 21/76877* (2013.01); *H01L 23/5283* (2013.01)

(58) Field of Classification Search
None
See application file for complete search history.

(56) References Cited

U.S. PATENT DOCUMENTS

| 10,431,495 | B1 | 10/2019 | Cheng et al. |
| 11,127,631 | B2 | 9/2021 | Lin et al. |

(Continued)

FOREIGN PATENT DOCUMENTS

| KR | 20160044406 A | 4/2016 |
| KR | 20170085929 A | 7/2017 |
| KR | 20190064376 A | 6/2019 |

OTHER PUBLICATIONS

Taiwan Notice of Allowance on TW Appl. Ser. No. 10-2020-0088745 dated Jun. 27, 2022 (7 pages).

(Continued)

*Primary Examiner* — Bradley Smith
(74) *Attorney, Agent, or Firm* — FOLEY & LARDNER LLP

(57) ABSTRACT

A semiconductor device includes a first gate structure extending along a first lateral direction. The semiconductor device includes a first interconnect structure, disposed above the first gate structure, that extends along a second lateral direction perpendicular to the first lateral direction. The first interconnect structure includes a first portion and a second portion electrically isolated from each other by a first dielectric structure. The semiconductor device includes a second interconnect structure, disposed between the first gate structure and the first interconnect structure, that electrically couples the first gate structure to the first portion of the first interconnect structure. The second interconnect structure includes a recessed portion that is substantially aligned with the first gate structure and the dielectric structure along a vertical direction.

20 Claims, 25 Drawing Sheets

(51) Int. Cl.
 *H01L 23/522* (2006.01)
 *H01L 23/528* (2006.01)

(56) References Cited

U.S. PATENT DOCUMENTS

| | | | |
|---|---|---|---|
| 11,469,298 | B2 | 10/2022 | Park et al. |
| 2006/0046449 | A1 | 3/2006 | Liaw |
| 2006/0237725 | A1* | 10/2006 | Jeong .................. H01L 27/0688 |
| | | | 257/69 |
| 2013/0161722 | A1* | 6/2013 | Son .................. H01L 29/66545 |
| | | | 257/379 |
| 2016/0365309 | A1 | 12/2016 | Zhang |
| 2017/0294347 | A1 | 10/2017 | Chi et al. |
| 2019/0043952 | A1 | 2/2019 | Thomas et al. |
| 2020/0006160 | A1 | 1/2020 | Lin et al. |
| 2020/0020584 | A1 | 1/2020 | Lin et al. |

OTHER PUBLICATIONS

Notice of Allowance on U.S. Appl. No. 16/803,497 dated May 10, 2022.

U.S. Office Action on U.S. Appl. No. 16/803,497 dated Oct. 20, 2021.

U.S. Office Action on U.S. Appl. No. 16/803,497 dated Feb. 2, 2022.

* cited by examiner

SEMICONDUCTOR DEVICE INCLUDING RECESSED INTERCONNECT STRUCTURE

CROSS-REFERENCE TO RELATED APPLICATION

This application is a divisional application of U.S. patent application Ser. No. 16/803,497 filed on Feb. 27, 2020, which is incorporated by reference herein in its entirety.

BACKGROUND

The semiconductor integrated circuit (IC) industry has experienced exponential growth. In semiconductor IC design, standard cells methodologies are commonly used for the design of semiconductor devices on a chip. Standard cell methodologies use standard cells as abstract representations of certain functions to integrate millions, or billions, devices on a single chip. As ICs continue to scale down, more and more devices are integrated into the single chip. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
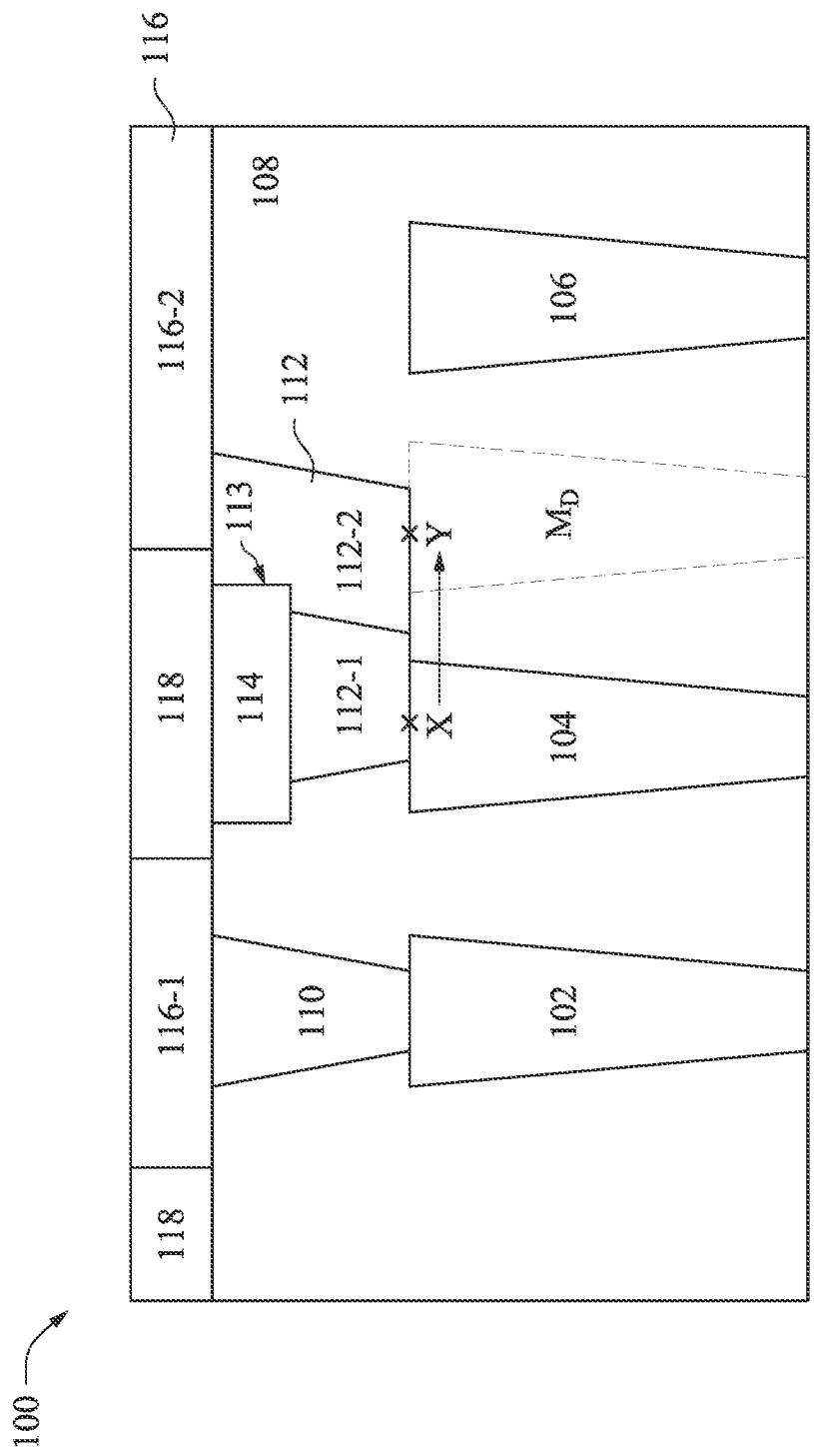
FIG. 1 illustrates a cross-sectional view of an example semiconductor device including a recessed interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the trend of scaling down the ICs, in general, the area of a standard cell shall be scaled down accordingly. The area of the standard cell can be scaled down by reducing a cell width of the cell and/or a cell height of the cell. The cell width is typically proportional to a number of gate structures or features (e.g., typically known as "POLY"), extending along a vertical direction, that the cell can contain; and the cell height is typically proportional to a number of signal tracks, extending along a horizontal direction, that the cell can contain. While reducing the cell height (e.g., by decreasing the number of signal tracks), the cell width (the number of gate structures) may be subjected to being increased, which may not efficiently reduce the total area. Although the number of gate structures can be forced to be unchanged (e.g., only reducing the number of signal tracks), fabricating a semiconductor device based on such a cell design can encounter various routing issues. For example, one or more interconnect structures may be formed (e.g., cut) to have relatively shorter width, partially due to the shortened cell width. It can become significantly difficult when landing an interconnect structure (e.g., a via structure) on such a shortened interconnect structure, which can likely cause a functional failure (e.g., a short circuit) of the cell.

The present disclosure provides various embodiments of a semiconductor device that can be represented by (or formed based on) a standard cell. An area of the standard cell can be reduced by concurrently reducing a cell height and a cell width of the standard cell, while being immune from the issues that exiting technology encounters. For example, the semiconductor device includes a number of transistors, each of which includes respective gate structure and source/drain structures. The gate structures can be respectively defined by a plurality of gate features of the cell, which are associated with the cell width of the cell. The gate structures and the source/drain structures can be connected by a plurality of interconnect structures, which are respectively defined by a number of signal tracks of the cell. The semiconductor device, as disclosed herein, includes one or more recessed interconnect structures each disposed between at least one corresponding gate structure and at least one corresponding interconnect structure. In some embodiments, the recessed interconnect structure can include a partially or fully recessed portion that is filled with a dielectric material. For example, a recessed interconnect structure, including a partially recessed portion, can laterally extend or shift the connection point of a corresponding gate structure, which causes a corresponding interconnect structure to be shifted accordingly. Thus, other interconnect structures (e.g., the interconnect structures adjacent to the interconnect structure connected to the gate structure) shall not be cut to have a shortened lateral width. As such, despite of reducing a number of the gate features and a number of the signal tracks of the cell (thereby reducing a total area of the cell), the above-identified issues that the existing technology is facing can be resolved. In some other embodiments, the recessed interconnect structure, including a fully recessed portion, can vertically shift the connection point of a corresponding conductive structure (e.g., one or more interconnect structures connected to the dummy gate structures and/or dummy source/drain structures), which allows an interconnect structure in an interconnect layer to be formed over the recessed interconnect structure. As such, routing resource of that interconnect layer can be advantageously reserved.

Referring to FIG. 1, a cross-sectional view of a portion of a semiconductor device 100, including a recessed interconnect structure, is depicted, in accordance with some embodiments. It is understood that the semiconductor device 100, as shown in FIG. 1, is simplified for purposes of illustration, and thus, the semiconductor device 100 can include any of various suitable features while remaining within the scope of the present disclosure. For example, the semiconductor device 100 may include a plurality of transistors (e.g., planar complementary metal-oxide-semiconductor field-effect transistors (NMOSFETs), fin-based field-effect transistors (FinFETs), nanosheet field-effect transistors, nanowire field-effect transistors, etc.), each of which is formed by respective gate structure and source/drain structures (or source/drain regions), while the illustrated embodiment of FIG. 1 may include some of the structures.

As shown, the semiconductor device 100 includes a first gate structure 102, a second gate structure 104, and a third gate structure 106 formed over a substrate (not shown). In some embodiments, the gate structures 102-106 may include a conductive material such as, for example, one or more metal materials, a polysilicon material, etc. Although not shown in FIG. 1, it is understood that each of the gate structures 102-106 is formed over one or more active regions (e.g., one or more conduction channels) with corresponding source/drain structures/regions disposed on the sides of the gate structure to function as a respective transistor. The source/drain structures can source/drain conduction current through the active region, which is gated (e.g., modulated) by the gate structure. For example, each of the gate structures 102-106 may be formed over (e.g., to straddle) the active region of a FinFET to modulate current conducting through the FinFET. Such functional structures of a transistor (and other active devices, for example, resistors, capacitors, etc.) are collectively referred to as front-end-of-line (FEOL) structures. The gate structures 102-106 are embedded in a dielectric layer 108. The dielectric layer 108 may include a dielectric material such as, for example, a low-k dielectric material, a ultra-low-k dielectric material. Such a dielectric layer 108 is typically referred to as an inter-layer dielectric (ILD) layer.

The semiconductor device 100 further includes an interconnect structure 116 formed over the dielectric layer 108. In some embodiments, the interconnect structure 116 may include a conductive material such as, for example, one or more metal materials. The layer containing such an interconnect structure 116, that is formed immediately above the gate structures, is sometimes referred to an "M0" layer. Typically, the structures formed in and above the M0 layer (e.g., M1 layer, M2 layer, etc.) are collectively referred to as back-end-of-line (BEOL) structures. To enable the intended functionality of the semiconductor device 100, each of the gate structures 102-106 may be electrically coupled to one or more BEOL structures. For example, the gate structure 102 is electrically coupled to an interconnect structure 116-1 of the interconnect structure 116; and the gate structure 104 is electrically coupled to an interconnect structure 116-2 of the interconnect structure 116. The interconnect structures 116-1 and 116-2 may be formed along the same signal track and separated (e.g., isolated) from each other by a dielectric structure 118.

The gate structure 102 can be electrically coupled to the interconnect structure 116-1 through an interconnect structure 110 extending through the dielectric layer 108; and the gate structure 104 can be electrically coupled to the interconnect structure 116-2 through an interconnect structure 112 extending through the dielectric layer 108. In some embodiments, the interconnect structure 110 may be formed as a via interconnect structure. Such a via interconnect structure 110, which connects a gate structure to an interconnect structure in the M0 layer that is vertically aligned with the gate structure, is sometimes referred to as a "VG."

According to various embodiments of the present disclosure, the interconnect structure 112, which connects a gate structure to an interconnect structure in the M0 layer that is not vertically aligned with (e.g., laterally displaced from) the gate structure, may be formed to include a recessed portion 112-1 and a non-recessed portion 112-2. As such, the interconnect structure 112 may be referred to as a partially recessed interconnect structure. The recessed portion 112-1 and non-recessed portion 112-2 may be formed as respective via structures that are abutted (or otherwise adjacent) to each other. The location of the recessed portion 112-1 might have been used to form a via structure (typically referred to as "VG") to connect the gate structure 104 to an interconnect structure in the M0 layer; and the location of the non-recessed portion 112-2 might have been used to form a via structure (typically referred to as "VD") to connect a source/drain interconnect structure (typically referred to as "MD") to an interconnect structure in the M0 layer. The source/drain interconnect structure MD (shown in dotted line of FIG. 1) can be formed to couple a source/drain structure (e.g., the source/drain structure formed on one of the sides of the gate structure 104) to an upper level of interconnect structure (e.g., 116-2). Such interconnect structures, e.g., VG, VD, MD, may be collectively referred to as middle-end-of-line (MEOL) structures. In some embodiments, the combination of the recessed portion 112-1 and the non-recessed portion 112-2 are sometimes referred to as "VG+VD."

Referring still to FIG. 1, in greater detail, the recessed portion 112-1 is recessed with respect to the non-recessed portion 112-2 to define a recess 113. In some embodiments, the recess 113 may be defined by misalignment or displacement of respective top boundaries of the recessed portion 112-1 and the non-recessed portion 112-2. The recess 113 is filled with a dielectric material to form a dielectric recess structure 114. Each of the two portions 112-1 and 112-2 is directly connected to either the gate structure 104 or the interconnect structure 116-2. For example, the recessed portion 112-1 is in direct contact with only the gate structure 104; and the non-recessed portion 112-2 is in direct contact with only the interconnect structure 116-2. In some other embodiments, the recessed portion 112-1 may be coupled to the gate structure 104 with one or more conductive layers (e.g., a TaN layer) disposed therebetween. Similarly, the non-recessed portion 112-2 may be coupled to the interconnect structure 116-2 with one or more conductive layers (e.g., a TaN layer) disposed therebetween.

By forming such a recessed interconnect structure 112, a connection point (or via structure landing point) of the gate structure 104 can be laterally shifted from point "X" to point "Y," as shown in FIG. 1. This allows the gate structure 104 to be electrically connected to the interconnect structure 116-2 that is laterally displaced from the gate structure 104. Further, by forming the dielectric recess structure 114 over the recessed portion 112-1, the gate structure 104 can be electrically isolated from any other interconnect structures (e.g., 116-1) but the interconnect structure 116-2. As such, a lateral width of the interconnect structure 116-2 can be formed to be sufficiently large, which can significantly reduce the possibility of failing in landing another interconnect structure (e.g., a via structure connecting the M0 layer 116 to the next upper interconnect layer, M1 layer, which typically referred to as "VIA0") on the interconnect structure 116-2. In the existing technology, in order to connect the gate structures 102 and 104 to the interconnect structures 116-1 and 116-2, respectively, at least an end portion of the interconnect structure 116-2 is frequently formed to be vertically aligned with the gate structure 104, which can significantly shorten or squeeze the lateral width of the interconnect structure 116-1. Accordingly, misalignment of the VIA0 may likely occur, which can fail in reaching the original functionality of the semiconductor device 100.

Figure 2:
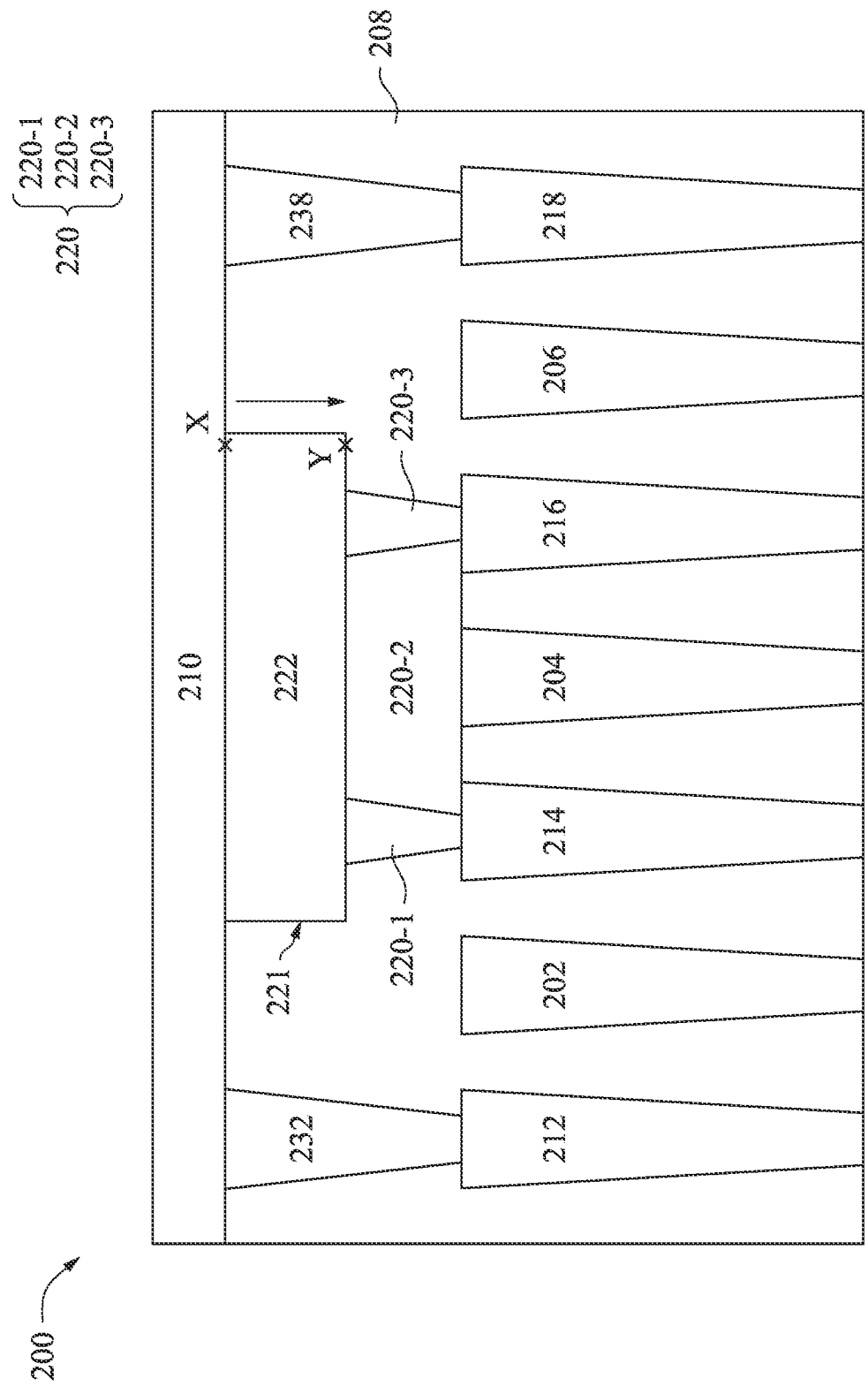
FIG. 2 illustrates a cross-sectional view of another example semiconductor device including a recessed interconnect structure, in accordance with some embodiments.

Referring to FIG. 2, a cross-sectional view of a portion of a semiconductor device 200, including a recessed interconnect structure, is depicted, in accordance with some embodiments. It is understood that the semiconductor device 200, as shown in FIG. 2, is simplified for purposes of illustration, and thus, the semiconductor device 200 can include any of various suitable features while remaining within the scope of the present disclosure. For example, the semiconductor device 200 may include a plurality of transistors (e.g., planar complementary metal-oxide-semiconductor field-effect transistors (planar MOSFETs), fin-based field-effect transistors (FinFETs), nanosheet field-effect transistors, nanowire field-effect transistors, complementary field-effect transistors (CFETs)), each of which is formed by respective gate structure and source/drain structures (or source/drain regions), while the illustrated embodiment of FIG. 2 includes some of the structures.

As shown, the semiconductor device 200 includes a first gate structure 202, a second gate structure 204, and a third gate structure 206 formed over a substrate (not shown). In some embodiments, the gate structures 202-206 may include a conductive material such as, for example, one or more metal materials, a polysilicon material, etc. Although not shown in FIG. 2, each of the gate structures 202-206 is formed over one or more active regions (e.g., one or more conduction channels) to modulate the respective transistor(s). For example, each of the gate structures 202-206 may be formed over (e.g., to straddle) the active region of a FinFET to modulate current conducting through the FinFET.

The semiconductor device 200 further includes a number of source/drain interconnect structures (MDs) 212, 214, 216, and 218 over the substrate. Although not shown in FIG. 2, each of the MDs 212-218 is formed over an active region (e.g., an epitaxially grown source/drain structure/region) to source or drain the respective transistor. For example, the MDs 212 and 214 may be connected to the source structure and drain structure of a first transistor, gated by the gate structure 202, to source and drain the first transistor, respectively; the MDs 214 and 216 may be connected to the source structure and drain structure of a second transistor, gated by the gate structure 204, to source and drain the second transistor, respectively; and the MDs 216 and 218 may be connected to the source structure and drain structure of a third transistor, gated by the gate structure 206, to source and drain the third transistor, respectively.

The gate structures 202-206 and MDs 212-218 are embedded in a dielectric layer 208. The dielectric layer 208 may include a dielectric material such as, for example, a low-k dielectric material, a ultra-low-k dielectric material. Such a dielectric layer 208 is typically referred to as an inter-layer dielectric (ILD) layer. Over the dielectric layer 208, an interconnect structure 210 may be formed to connect one or more of the gate structures 202-206 and/or the MDs 212-218. Similar as the interconnect structure 116, a layer containing the interconnect structure 210 is typically referred to as the M0 layer.

In certain cases, the second transistor, constituted by the gate structure 204, the source/drain structures 214-216, may function as a dummy transistor in the semiconductor device 200. The dummy transistor may have no active function during operation of the semiconductor device 200. As such, the gate structure 204 and the source/drain structures 214-216 can be connected to one another through an interconnect structure 220. In this regard, the interconnect structure 220 may include (or be coupled to) a recess, e.g., 221, according to some embodiments. The recess 221 is filled with a dielectric material to form a dielectric recess structure 222. The MD 212 can be electrically coupled to the interconnect structure 210 through an interconnect structure 232 (hereinafter "VD 232") extending through the dielectric layer 208; and the MD 218 can be electrically coupled to the interconnect structure 210 through an interconnect structure 238 (hereinafter "VD 238") extending through the dielectric layer 208.

The interconnect structure 220 may be formed to include one or more recessed portions 220-1, 220-2, and 220-3. As such, the interconnect structure 220 may be referred to as a fully recessed interconnect structure. In accordance with some embodiments, the recessed portion 220-1 to 220-3 may be formed as respective via structures that are abutted (or otherwise adjacent) to each other. The location of the recessed portion 220-1 might have been used to form a VD to connect the MD 214 to the interconnect structure 210; the location of the recessed portion 220-2 might have been used to form a VG to connect the gate structure 204 to the interconnect structure 210; and the location of the recessed portion 220-3 might have been used to form a VD to connect the MD 216 to the interconnect structure 210. In some embodiments, the combination of the recessed portions 220-1 to 220-3 are sometimes referred to as "VD+VG+VD."

In the existing technology, the gate structure 204 and the source/drain structures 214-216, which constitute a dummy transistor, are connected to each other through a cut portion of the interconnect structure 210. Thus, in order to connect the MDs 212 and 218, at least one interconnect structure in an interconnect layer next upper than the M0 layer (e.g., an M1 layer) is required, which can significantly waste routing resource at the M1 layer. In contrast, by forming the recessed interconnect structure 220, a connection point of one or more interconnect structures (e.g., 220-1, 220-2, 220-3) can be vertically shifted from point "X" to point "Y," as shown in FIG. 2. This allows the MDs 212 and 218 to be connected to each other directly through the interconnect structure 210, which can reserve the routing resource in the next upper interconnect layer.

As discussed above, by forming the disclosed recessed interconnect structure (e.g., 112 of FIG. 1) for connecting a FEOL conductive structure (e.g., 104 of FIG. 1), a connection point of the FEOL conductive structure can be laterally shifted to allow a BEOL interconnect structure corresponding to the FEOL to be laterally shifted accordingly. Consequently, the adjacent BEOL interconnect structure(s) can be formed to have a sufficiently large landing width. This alleviates various routing issues that the existing technology is currently facing, for example, when the dimension of a standard cell is increasingly scaled down. Below are various example layout designs of a circuit that are constructed based on adopting the recessed interconnect structure.

Figure 3:
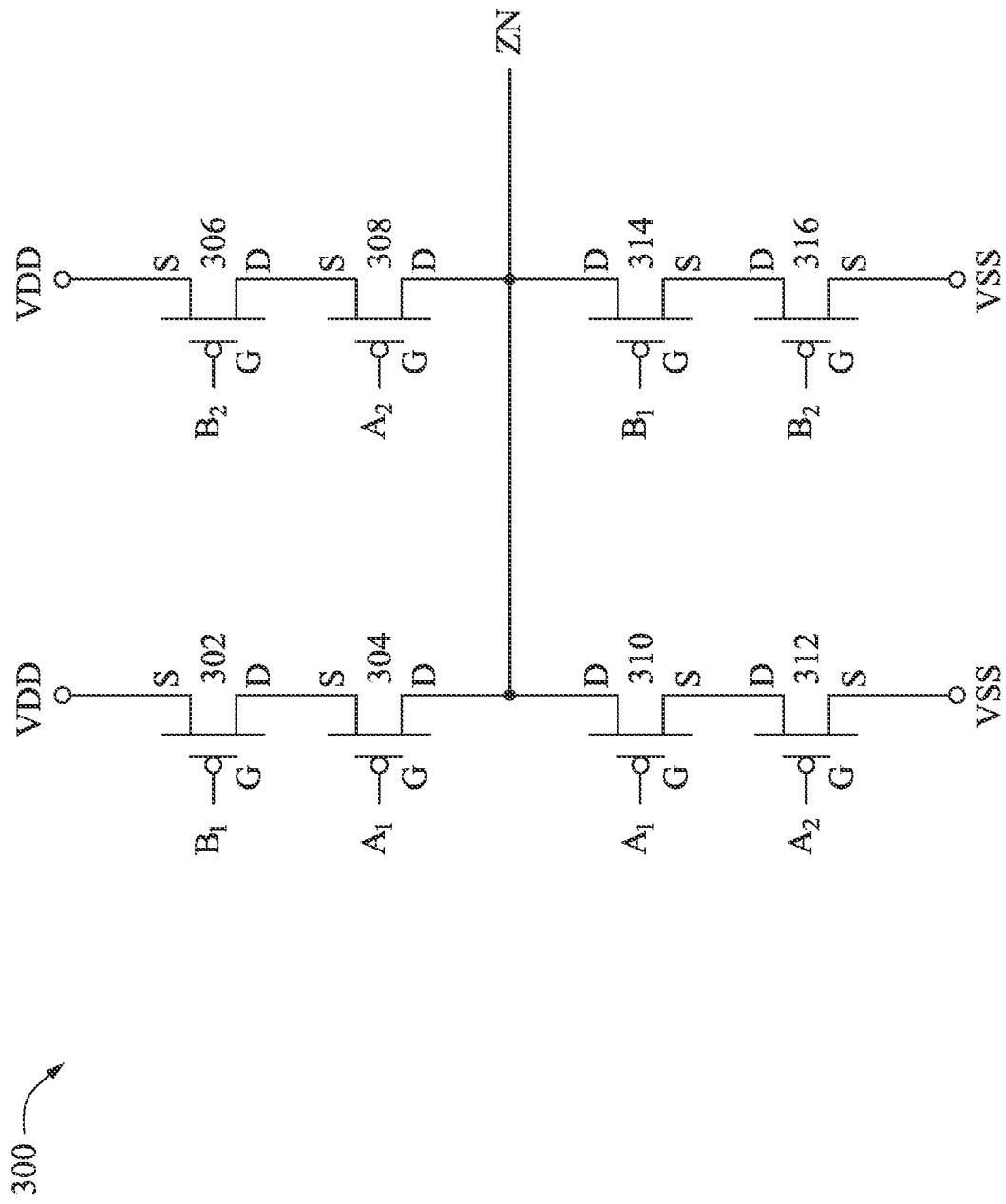
FIG. 3 illustrates a circuit diagram of an example circuit, in accordance with some embodiments.

Referring first to FIG. 3, a circuit diagram of an example circuit 300 is depicted. The circuit 300 includes an AND-OR-Invert (AOI) logic circuit. The AOI logic circuit is generally constructed from the combination of one or more AND gates followed by a NOR gate. As shown in FIG. 3, the circuit 300 has four inputs: A1, A2, B1, and B2; and one output ZN that configured to perform the following Boolean function: $\overline{(A1 \wedge A2) \vee (B1 \wedge B2)}$. To perform the function, the circuit 300 can include eight transistors 302, 304, 306, 308, 310, 312, 314, and 316 electrically coupled to one another. The transistors 302-308 can be each implemented as a p-type MOS transistor; and the transistors 310-316 can be each implemented as an n-type MOS transistor. However, it is understood that each of the transistors 302-316 can be implemented as any of various other type of transistor.

In an embodiment, a drain of the transistors 302 is connected to a source of the transistor 304; and a drain of the transistors 306 is connected to a source of the transistor 308. The transistor 302 is gated by an interconnect structure configured to receive the input B1, and sourced by a first supply voltage (e.g., VDD); the transistor 304 is gated by an interconnect structure configured to receive the input A1, and drained to an interconnect structure configured to provide the output ZN; the transistor 306 is gated by an interconnect structure configured to receive the input B2, and sourced by the first supply voltage (e.g., VDD); and the transistor 308 is gated by an interconnect structure configured to receive the input A2, and drained to the interconnect structure configured to provide the output ZN. A drain of the transistors 310 is connected to the drain of the transistor 304 and also drained to the interconnect structure configured to provide the output ZN; and a drain of the transistors 314 is connected to the drain of the transistor 308 and also drained to the interconnect structure configured to provide the output ZN. The transistor 310 is gated by the interconnect structure configured to receive the input A1; and the transistor 314 is gated by the interconnect structure configured to receive the input B1. The source of the transistors 310 is connected to a drain of the transistor 312; and the source of the transistors 314 is connected to a drain of the transistor 316. The transistor 312 is gated by the interconnect structure configured to receive the input A2, and sourced by a second supply voltage (e.g., VSS); and the transistor 316 is gated by the interconnect structure configured to receive the input B2, and sourced by the second supply voltage (e.g., VSS).

Figure 4:
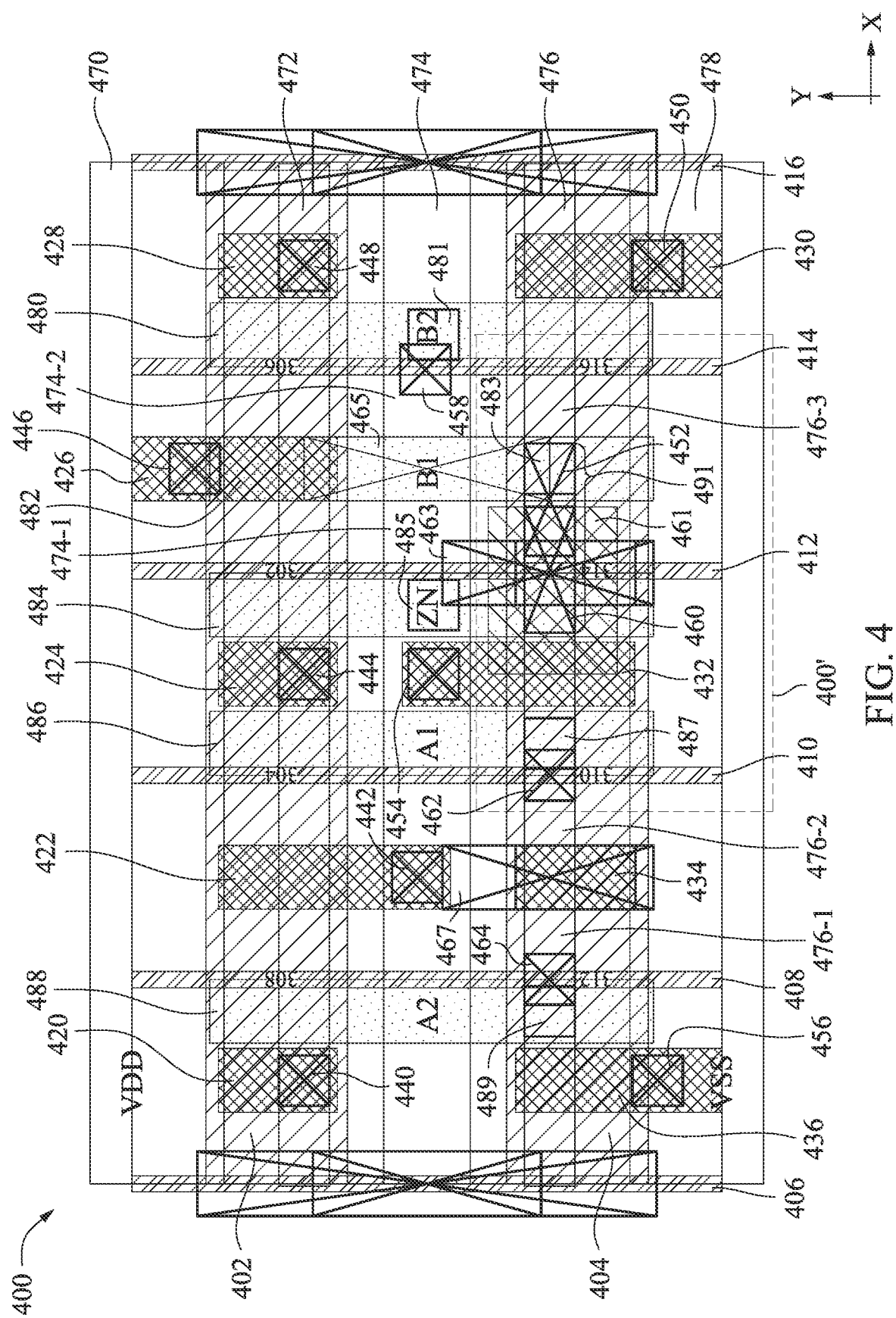
FIG. 4 illustrates an example layout design of a standard cell representing the circuit of FIG. 3, in accordance with some embodiments.

Referring to FIG. 4, an example layout design 400 of a standard cell is depicted, in accordance with some embodiments. The layout design 400 may be used to fabricate at least a portion of a semiconductor device (e.g., 500 in FIG. 5) functioning as the circuit 300 of FIG. 3. By adopting the recessed interconnect structures disclosed herein, the dimension (e.g., area) of the layout design 400 (or the standard cell) can be scaled down while being immune from the above-identified routing issues. For example, a cell width of the standard cell may be reduced to being proportional to a relatively low number of gate structures (e.g., 5 or less gate structure spaces), and a cell height of the standard cell may be reduced to being proportional to a relatively low number of signal tracks (e.g., 3 or less M0 interconnect structure spaces).

The semiconductor device corresponding to the layout design 400 may be fabricated based on forming the respective active feature of the transistors 302-316 along a single level of active regions. Such an active region may be a fin-shaped region of one or more three-dimensional field-effect-transistors (e.g., FinFETs, gate-all-around (GAA) transistors including nanosheet transistors and nanowire transistors), or an oxide-definition (OD) region of one or more planar metal-oxide-semiconductor field-effect-transistors (MOSFETs), wherein the active region may serve as a source feature or drain feature of the respective transistor(s). The term "single level" of multiple active regions may be referred to as the active regions being formed along a single lateral plane, in some embodiments of the present disclosure.

In FIG. 4, the layout design 400 includes patterns 402 and 404. The patterns 402 and 404 may extend along the X direction, that are configured to form active regions over a substrate, hereinafter "active region 402" and "active region 404," respectively. The active region 402 may be characterized with a first conduction type, and the active region 404 may be characterized with a second conduction type. For example, the active region 402 includes a p-type doped region, and the active region 404 includes an n-type doped region. The layout design 400 can be used to form the transistors 302-316 in various configurations. In one example where the transistors 302-316 are to be formed as FinFETs, the active region 402 may be formed as a p-type fin-based structure over a substrate, and the active region 404 may be formed as an n-type fin-based structure over the substrate. In another example where the transistor 302-316 are to be formed as nanosheet transistors, the active region 402 may be formed as one or more p-type nanosheets stacked on top of one another over a substrate, and the active region 404 may be formed as one or more n-type nanosheets stacked on top of one another over the substrate. In yet another example where the transistors 302-316 are to be formed as planar MOSFETs, the active region 402 may be formed as a p-type region recessed in a substrate, and the active region 404 may be formed as an n-type region recessed in the substrate.

The layout design 400 includes patterns 406, 408, 410, 412, 414, and 416. The patterns 406, 408, 410, 412, 414, and 416 may extend along the Y direction, that are configured to form gate structures, hereinafter "gate structure 406," "gate structure 408," "gate structure 410," "gate structure 412," "gate structure 414," and "gate structure 416," respectively. The gate structure 406 may be disposed along or over a first boundary of the layout design 400 (or the cell), and the gate structure 416 may be disposed along or over a second boundary of the layout design 400 (or the cell). The gate structures 406 and 416 may not provide an electrical or conductive path, and may prevent or at least reduce/minimize current leakage across components between which the gate structures 406 and 416 are located. The gate structures 406 and 416 can include dummy polysilicon lines, which are sometimes referred to as PODEs. Each of the remaining gate structures 408-414, formed of one or more conductive materials (e.g., polysilicon(s), metal(s)), can overlay respective portions of the active regions 402 and 404 to define one of the transistors 302-316.

For example, the portion of the gate structure 408 that overlays the active region 402 can define the gate of the transistor 308, and the portions of the active region 402 that are disposed on the left-hand side and right-hand side of the gate structure 408 can define the source and drain of the transistor 308, respectively. The portion of the gate structure 410 that overlays the active region 402 can define the gate of the transistor 304, and the portions of the active region 402 that are disposed on the left-hand side and right-hand side of the gate structure 410 can define the drain and source of the transistor 304, respectively. The portion of the gate structure 412 that overlays the active region 402 can define the gate of the transistor 302, and the portions of the active region 402 that are disposed on the left-hand side and right-hand side of the gate structure 412 can define the drain and source of the transistor 302, respectively. The portion of the gate structure 414 that overlays the active region 402 can define the gate of the transistor 306, and the portions of the active region 402 that are disposed on the left-hand side and right-hand side of the gate structure 414 can define the source and drain of the transistor 306, respectively. The portion of the gate structure 408 that overlays the active region 404 can define the gate of the transistor 312, and the portions of the active region 404 that are disposed on the left-hand side and right-hand side of the gate structure 408 can define the source and drain of the transistor 312, respectively. The portion of the gate structure 410 that overlays the active region 404 can define the gate of the transistor 310, and the portions of the active region 404 that are disposed on the left-hand side and right-hand side of the gate structure 410 can define the source and drain of the transistor 310, respectively. The portion of the gate structure 412 that overlays the active region 404 can define the gate of the transistor 314, and the portions of the active region 404 that are disposed on the left-hand side and right-hand side of the gate structure 412 can define the drain and source of the transistor 314, respectively. The portion of the gate structure 414 that overlays the active region 404 can define the gate of the transistor 316, and the portions of the active region 404 that are disposed on the left-hand side and right-hand side of the gate structure 414 can define the drain and source of the transistor 316, respectively.

The layout design 400 includes patterns 420, 422, 424, 426, 428, 430, 432, 434, and 436. The patterns 420, 422, 424, 426, 428, 430, 432, 434, and 436 may extend along the Y direction, that are configured to form source/drain interconnect structures (e.g., MDs), hereinafter "MD 420," "MD 422," "MD 424," "MD 426," "MD 428," "MD 430," "MD 432," "MD 434," and "MD 436." Each of the MDs 420-436 may electrically couple the source or drain of a corresponding transistor to an interconnect structure through a via interconnect structure.

The layout design 400 includes patterns 440, 442, 444, 446, 448, 450, 452, 454, and 456. The patterns 440, 442, 444, 446, 448, 450, 452, 454, and 456 may be configured to form via interconnect structures (e.g., VDs), hereinafter "VD 440," "VD 442," "VD 444," "VD 446," "VD 448," "VD 450," "VD 452," "VD 454," and "VD 456." Each of the VDs 440-456, except for the VD 452, may extend along a vertical direction (e.g., a direction perpendicular to the X direction and the Y direction) by a respective height in order to electrically couple a corresponding MD to an interconnect structure.

The layout design 400 includes patterns 458, 460, 462, and 464. The patterns 458, 460, 462, and 464 may be configured to form via interconnect structures (e.g., VGs), hereinafter "VG 458," "VG 460," "VG 462," and "VG 464." Each of the VGs 458-464, except for the VG 460, may extend along a vertical direction (e.g., a direction perpendicular to the X direction and the Y direction) by a respective height in order to couple a corresponding gate structure to an interconnect structure. In some embodiments, the patterns 452 and 460 may be partially overlapped with each other to form a combination of VD and VG, hereinafter "VD+VG 491." Further, the layout design 400 includes a pattern 461 overlapping respective portions of the pattern 452 and 460 to form a dielectric recess structure (hereinafter "recess 461") by filling a recessed upper portion of the VD+VG 491 with a dielectric material.

The layout design 400 includes patterns 470, 472, 474, 476, and 478. The patterns 470, 472, 474, 476, and 478 may extend along the X direction, that are configured to form interconnect structures (e.g., M0 signal tracks or power rails) over the substrate, hereinafter "power rail 470," "M0 track 472," "M0 track 474," "M0 track 476" and "power rail 478," respectively. In some embodiments, the power rail 470, disposed along or over a third boundary of the layout design (cell), may be configured to carry a first supply voltage (e.g., VDD); and the power rail 478, disposed along or over a fourth boundary of the layout design (cell), may be configured to carry a second supply voltage (e.g., VSS). To connect the transistors 302-316 as shown in FIG. 3, some of the M0 tracks may be "cut" into a plurality of portions by one or more M0 cut patterns. For example, the M0 track 474 may be cut into M0 track portions 474-1 and 474-2 by a cut pattern 465 (hereinafter "cut M0 465"); and the M0 track 476 may be cut into M0 track portions 476-1, 476-2, and 476-3 by a cut pattern 467 (hereinafter "cut M0 467") and a cut pattern 463 (hereinafter "cut M0 463"), respectively. In some embodiments, the cut MOs 463, 465, and 467 may be filled or refilled with a dielectric material to electrically isolate corresponding M0 track portions from each other.

The correspondence between the layout design 400 (FIG. 4) and the circuit 300 (FIG. 3) can be further illustrated through the following discussion. For example, both of the portion of the active region 402 on the right-hand side of the gate structure 412 (the source of the transistor 302) and the portion of the active region 402 on the left-hand side of the gate structure 414 (the source of the transistor 306) are electrically coupled to the power rail 470 (VDD) by the MD 426 and VD 446. Both of the portion of the active region 404 on the right-hand side of the gate structure 410 (the drain of the transistor 310) and the portion of the active region 404 on the left-hand side of the gate structure 412 (the drain of the transistor 314) are electrically coupled to the M0 signal track 474, which can be connected to an interconnect structure configured to provide the output ZN that is disposed at the next upper interconnect layer (e.g., M1 layer), by the MD 432 and VD 454. The portion of the active region 404 on the left-hand side of the gate structure 408 (the source of the transistor 312) is electrically coupled to VSS (the power rail 478) by the MD 436 and VD 456.

Figure 5:
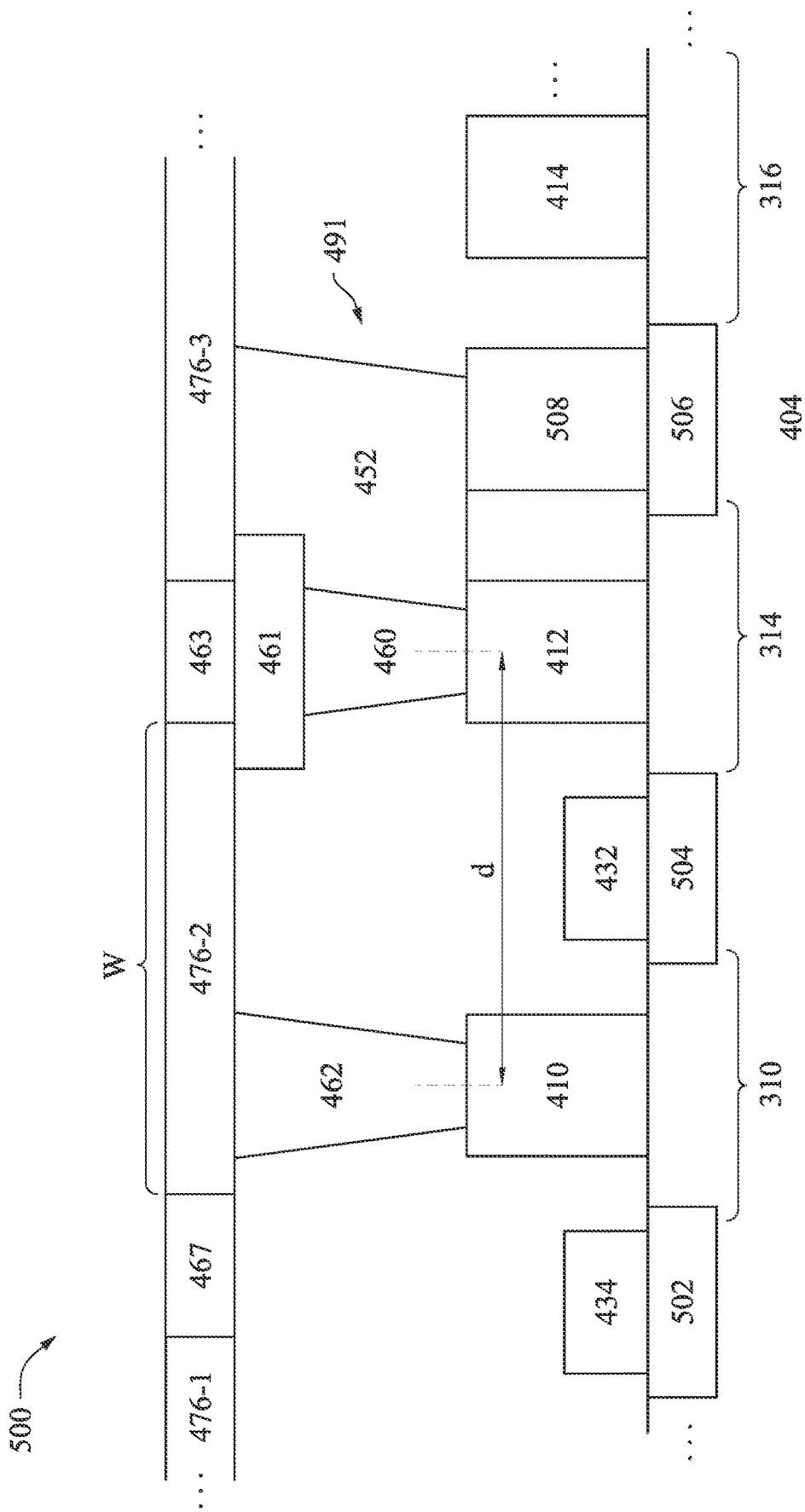
FIG. 5 illustrates a cross-sectional view of a semiconductor device, formed by at least a portion of the layout design of FIG. 4, that includes a recessed interconnect structure, in accordance with some embodiments.

Referring to FIG. 5, a cross-sectional view of a portion of the above-mentioned semiconductor device 500, made according to the layout design 400, is depicted, in accordance with some embodiments. It is understood that the semiconductor device 500 shown in FIG. 5 is not a completed semiconductor device functioning as the circuit 300 (FIG. 3). For example, the cross-sectional view in FIG. 5 depicts a portion of the semiconductor device 500 that is made according to the portion 400' of the layout design. As shown in FIG. 5, the gate structures 410, 412, and 414 are disposed over the active region 404 to form the transistor 310's gate, the transistor's 314's gate, and the transistor's 316's gate, respectively, with the transistor 310's source (hereinafter "source/drain region 502"), the transistor 310's drain and transistor 314's drain (hereinafter "source/drain region 504") and transistor 314's source and transistor 316's drain (hereinafter "source/drain region 506") formed in the active region 404. Corresponding to the layout design 400' of FIG. 4, the MD 434, connected to the source/drain region 502, is disposed on the left-hand side of the gate structure 410. The MD 434 may be vertically aligned with the cut M0 467. The gate structure 410 is connected to the M0 track portion 476-2 through the VG 462. The MD 432, connected to the source/drain region 504, is disposed on the right-hand side of the gate structure 410 but not connected to the M0 track portion 476-2. The gate structure 412 is connected to the M0 track portion 476-3 through the combination of VG 460 and VD 452 (VD+VG 491) with the recess 461 filling an upper portion of the combination of the VD+VG 491. In some embodiments, at least a portion of the recess 461 is vertically aligned with the cut M0 463 (filled with a dielectric material) and the gate structure 412. As such, the gate structure 412 can be electrically coupled to the M0 track portion 476-3 while electrically isolated from one or more other M0 track portions (e.g., 476-2). Further, the VD+VG 491 is electrically isolated from the source/drain region 506 by a dielectric feature 508.

By recessing the VD+VG 491, a connection point of the gate structure 412 can be laterally shifted from approximately where the gate structure 412 is formed to approximately where the source/drain region 506 is formed. The cut M0 463 can be accordingly shifted from approximately where the MD 432 is formed to approximately where the gate structure 412 is formed. As such, a lateral width "W" of the M0 track portion 476-2 shall not be squeezed. In some embodiments, the width W can be maintained at least 1.5 times a distance "d" between adjacent ones of the gate structures (e.g., between 410 and 412).

Referring again to FIG. 4, the layout design 400 includes patterns 481, 483, 485, 487, and 489. The patterns 481, 483, 485, 487, and 489 may be configured to form via interconnect structures (e.g., VIA0) over the respective M0 tracks, hereinafter "VIA0 481," "VIA0 483," "VIA0 485," "VIA0 487" and "VIA0 489," respectively. Each of the VIA0s 481-489 may extend along a vertical direction (e.g., a direction perpendicular to the X direction and the Y direction) by a respective height in order to electrically couple a corresponding M0 track to an interconnect structure at the next upper interconnect layer (e.g., M1 layer).

The layout design 400 includes patterns 480, 482, 484, 486, and 488. The patterns 480, 482, 484, 486, and 488 may be configured to form interconnect structures (e.g., M1 tracks) at the next upper interconnect layer M1, hereinafter "M1 track 480," "M1 track 482," "M1 track 484," "M1 track 486" and "M1 track 488," respectively. Each of the M1 tracks 480-488 may be configured to either receive one of the inputs A1, A2, B1, and B2 (FIG. 3), or provide the output ZN (FIG. 3). For example, the M1 track 480 is configured for receiving the input B2. From the M1 track 480, through the VIA0 481, further through the M0 track 474, and then through the VG 458, the input B2 can be coupled to the gate structure 414 (the gates of the transistors 306 and 316). In another example, the M1 track 482 is configured for receiving the input B1. From the M1 track 482, further through the M0 track 476, and then through the VD+VG 491, the input B1 can be coupled to the gate structure 412 (the gates of the transistors 302 and 314).

Figure 6A:
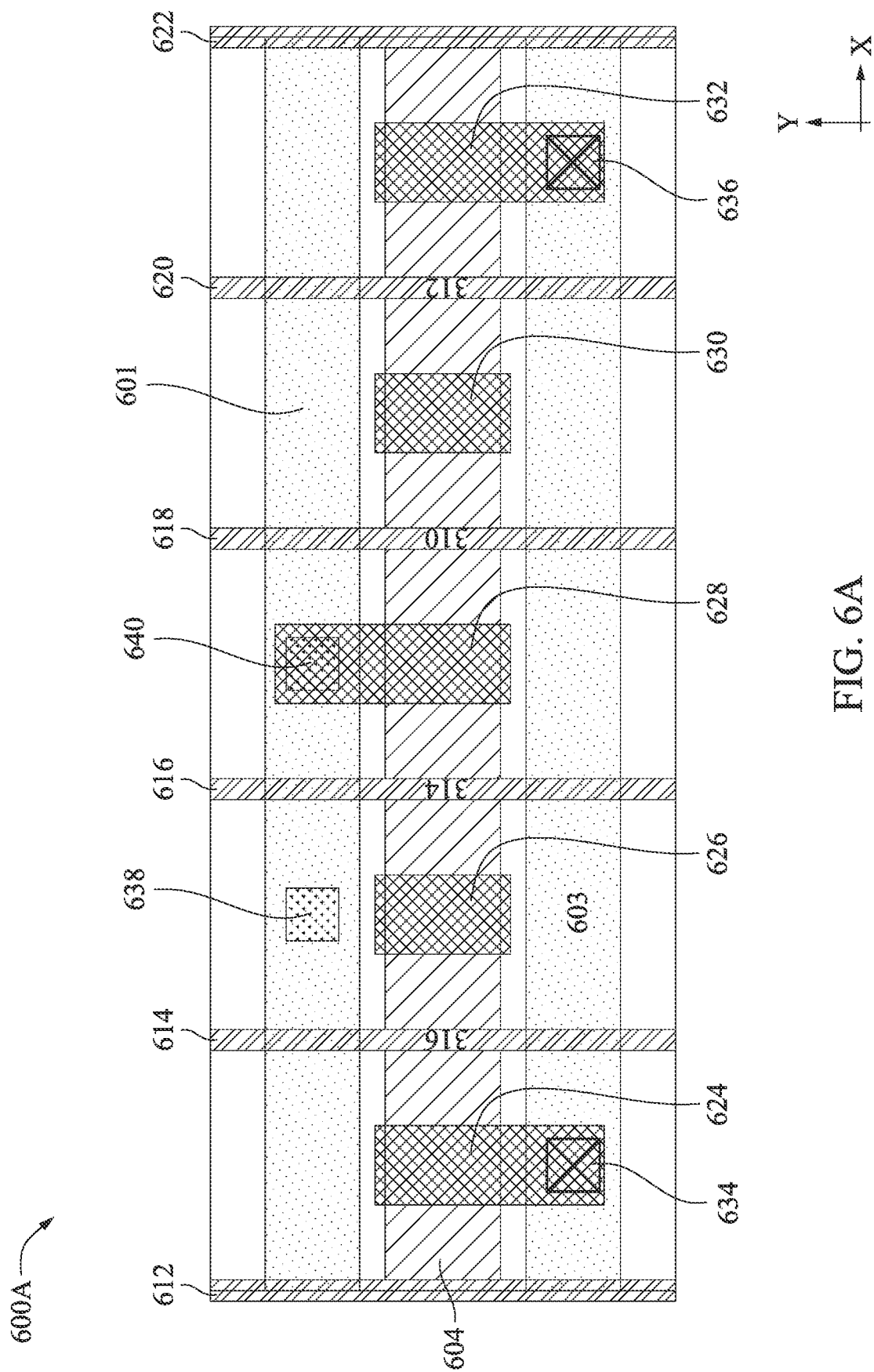
FIGS. 6A and 6B illustrate example layout designs of a standard cell representing the circuit of FIG. 3, in accordance with some embodiments.
Figure 6B:
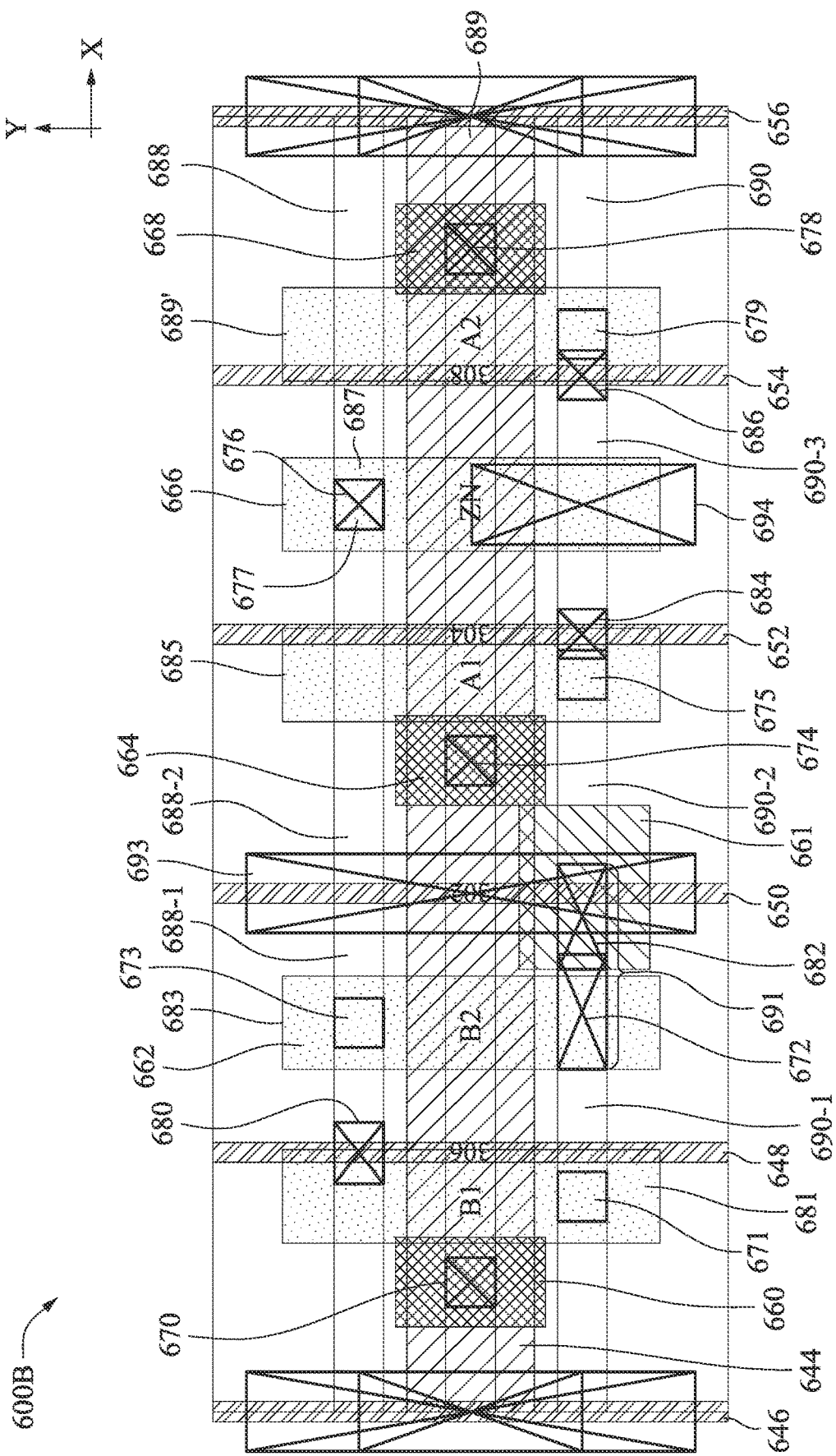

Referring to FIGS. 6A and 6B, example layout designs 600A and 600B of a standard cell are respectively depicted, in accordance with some embodiments. The layout designs 600A and 600B may be used to fabricate at least a portion of a semiconductor device (e.g., 700 in FIG. 7) functioning as the circuit 300 of FIG. 3. By adopting the recessed interconnect structures disclosed herein, the dimension (e.g., area) of the layout designs 600A and 600B (or the standard cells) can be scaled down while being immune from the above-identified routing issues. For example, a cell width of the standard cell may be reduced to being proportional to a relatively low number of gate structures (e.g., 5 or less gate structure spaces), and a cell height of the standard cell may be reduced to being proportional to a relatively low number of signal tracks (e.g., 3 or less M0 interconnect structure spaces).

The semiconductor device corresponding to the layout designs 600A and 600B may be fabricated based on forming the respective active feature of the transistors 302-308, having a first conduction type, along a first level of active regions, and the respective active feature of the transistors 310-316, having a second conduction type, along a second level of active regions. The first level and the second level may be vertically aligned with each other. The structure/configuration to place different conduction types of transistors at two vertically aligned levels is sometimes referred to as a complementary field-effect transistor (CFET) configuration. In some embodiments, power rails of such a CFET can be disposed either above the upper level where one of the first or second conduction types of transistors are formed, or below the lower level where the other of the first or second conduction types of transistors are formed. When placing the power rails below the lower level, the CFET is typically referred to as a CFET with buried power. By burying the power rails, the area (e.g., the cell height) of a corresponding cell can be further reduced, for example, by about 30~40%. The semiconductor device 700, as shown in FIG. 7, provides an example of such a CFET having buried power.

Figure 7:
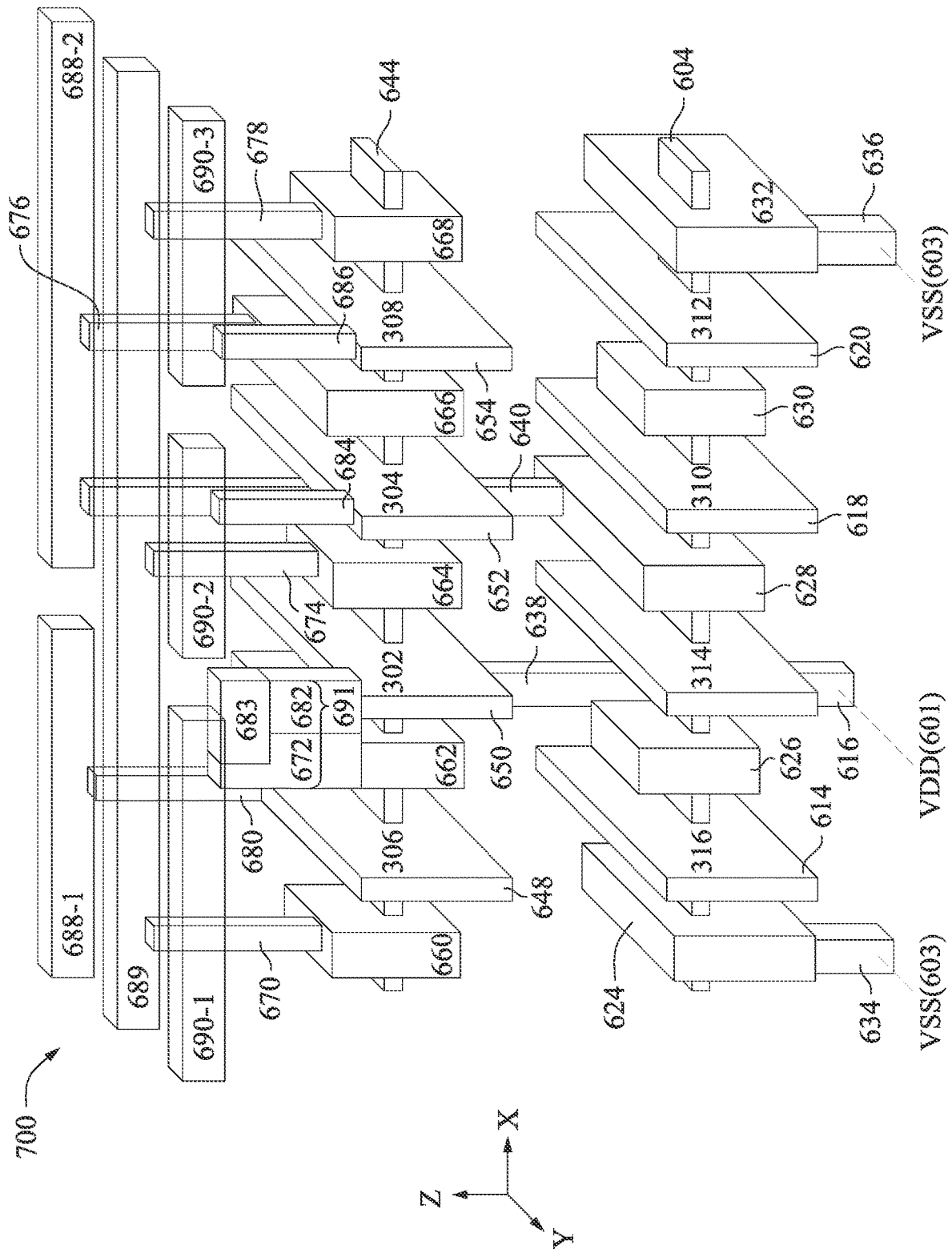
FIG. 7 illustrates a perspective view of a semiconductor device, formed by at least a portion of the layout designs of FIGS. 6A-B, that includes a recessed interconnect structure, in accordance with some embodiments.

FIG. 7 provides a perspective view of the semiconductor device 700, made based on the layout designs 600A and 600B, in accordance with some embodiments. Accordingly, the layout designs 600A and 600B shall be discussed in conjunction with FIG. 7. It is understood that the semiconductor device 700 of FIG. 7 has been simplified for purposes of illustration, and thus, some of the features/regions/structures included in the layout designs 600A and 600B may not be shown in FIG. 7.

In FIG. 6A, the layout design 600A includes pattern 604. The pattern 604 may extend along the X direction, that is configured to form an active region over a substrate at a lower level, hereinafter "active region 604." The active region 604 may be characterized with a first conduction type. For example, the active region 604 includes an n-type doped region. The active region 604 can form the transistors 310-316 in various configurations such as, for example, FinFETs, nanosheet transistors, etc.

The layout design 600A includes patterns 612, 614, 616, 618, 620, and 622. The patterns 612, 614, 616, 618, 620, and 622 may extend along the Y direction, that are configured to form gate structures at the lower level, hereinafter "gate structure 612," "gate structure 614," "gate structure 616," "gate structure 618," "gate structure 620," and "gate structure 622," respectively. The gate structure 612 may be disposed along or over a first boundary of the layout design 600A (or the cell), and the gate structure 622 may be disposed along or over a second boundary of the layout design 600A (or the cell). The gate structures 612 and 622 may not provide an electrical or conductive path, and may prevent or at least reduce/minimize current leakage across components between which the gate structures 612 and 622 are located. The gate structures 612 and 622 can include dummy polysilicon lines, which are sometimes referred to as PODEs. Each of the remaining gate structures 614-620, formed of one or more conductive materials (e.g., polysilicon(s), metal(s)), can overlay respective portions of the active region 604 to define one of the transistors 310-316.

For example, the portion of the gate structure 614 that overlays the active region 604 can define the gate of the transistor 316, and the portions of the active region 604 that are disposed on the left-hand side and right-hand side of the gate structure 614 can define the source and drain of the transistor 316, respectively. The portion of the gate structure 616 that overlays the active region 604 can define the gate of the transistor 314, and the portions of the active region 604 that are disposed on the left-hand side and right-hand side of the gate structure 616 can define the source and drain of the transistor 314, respectively. The portion of the gate structure 618 that overlays the active region 604 can define the gate of the transistor 310, and the portions of the active region 604 that are disposed on the left-hand side and right-hand side of the gate structure 618 can define the drain and source of the transistor 310, respectively. The portion of the gate structure 620 that overlays the active region 604 can define the gate of the transistor 312, and the portions of the active region 604 that are disposed on the left-hand side and right-hand side of the gate structure 620 can define the source and drain of the transistor 312, respectively.

The layout design 600A includes patterns 601 and 603. The patterns 601 and 603 may extend along the X direction, that are configured to form power rails over the substrate, hereinafter "power rail 601" and "power rail 603," respectively. In some embodiments, the power rail 601, disposed along a third boundary of the layout design (cell), may be configured to carry a first supply voltage (e.g., VDD); and the power rail 603, disposed along a fourth boundary of the layout design (cell), may be configured to carry a second supply voltage (e.g., VSS). In some embodiments, the power rails 601 and 603 may be disposed below the active region 604.

The layout design 600A includes patterns 624, 626, 628, 630, and 632. The patterns 624, 626, 628, 630, and 632 may extend along the Y direction, that are configured to form source/drain interconnect structures (e.g., MDs) at the lower level, hereinafter "MD 624," "MD 626," "MD 628," "MD 630," and "MD 632." Each of the MDs 624, 628, and 632 may electrically couple the source or drain of a corresponding transistor to an interconnect structure through a via interconnect structure.

The layout design 600A includes patterns 634, 636, 638, and 640. The patterns 634, 636, 638, and 640 may be configured to form via interconnect structures (e.g., VDs), hereinafter "VD 634," "VD 636," "VD 638," and "VD 640." Each of the VDs 634-640 may extend along a vertical direction (e.g., a direction perpendicular to the X direction and the Y direction) by a respective height in order to electrically couple a corresponding MD to an interconnect structure, or a power rail. For example in the perspective view of FIG. 7, the VD 634 can vertically extend (e.g., along the Z direction) to electrically couple the MD 624 to the power rail 603 (not shown in FIG. 7); the VD 638 can vertically extend (e.g., along the Z direction) to electrically couple the power rail 601 (not shown in FIG. 7) to an interconnect structure (e.g., MD 662) at the upper level; and the VD 636 can vertically extend (e.g., along the Z direction) to electrically couple the MD 632 to the power rail 603 (not shown in FIG. 7).

In FIG. 6B, the layout design 600B includes pattern 644. The pattern 644 may extend along the X direction, that is configured to form an active region over a substrate at an upper level, hereinafter "active region 644." The active region 644 may be characterized with a second conduction type. For example, the active region 644 includes a p-type doped region. The active region 644 can form the transistors 302-308 in various configurations such as, for example, FinFETs, nanosheet transistors, etc.

The layout design 600B includes patterns 646, 648, 650, 652, 654, and 656. The patterns 646, 648, 650, 652, 654, and 656 may extend along the Y direction, that are configured to form gate structures at the upper level, hereinafter "gate structure 646," "gate structure 648," "gate structure 650," "gate structure 652," "gate structure 654," and "gate structure 656," respectively. In some embodiments, the gate structures 646, 648, 650, 652, 654, and 656 may be vertically aligned with (and/or electrically coupled to) the gate structures 612, 614, 616, 618, 620, and 622, respectively, as illustrated in FIG. 7. In some embodiments, the gate structures 646, 648, 650, 652, 654, and 656 may be integrally merged with the gate structures 612, 614, 616, 618, 620, and 622, respectively. Thus, the gate structures 646 and 656 can be formed as PODEs. Each of the remaining gate structures 648-654, formed of one or more conductive materials (e.g., polysilicon(s), metal(s)), can overlay respective portions of the active region 644 to define one of the transistors 302-308.

For example, the portion of the gate structure 648 that overlays the active region 644 can define the gate of the transistor 306, and the portions of the active region 644 that are disposed on the left-hand side and right-hand side of the gate structure 648 can define the drain and source of the transistor 306, respectively. The portion of the gate structure 650 that overlays the active region 644 can define the gate of the transistor 302, and the portions of the active region 644 that are disposed on the left-hand side and right-hand side of the gate structure 650 can define the source and drain of the transistor 314, respectively. The portion of the gate structure 652 that overlays the active region 644 can define the gate of the transistor 304, and the portions of the active region 644 that are disposed on the left-hand side and right-hand side of the gate structure 652 can define the source and drain of the transistor 304, respectively. The portion of the gate structure 654 that overlays the active region 644 can define the gate of the transistor 308, and the portions of the active region 644 that are disposed on the left-hand side and right-hand side of the gate structure 654 can define the drain and source of the transistor 308, respectively.

The layout design 600B includes patterns 660, 662, 664, 666, and 668. The patterns 660, 662, 664, 666, and 668 may extend along the Y direction, that are configured to form source/drain interconnect structures (e.g., MDs) at the upper level, hereinafter "MD 660," "MD 662," "MD 664," "MD 666," and "MD 668." Each of the MDs 660, 662, 664, 666, and 668 may electrically couple the source or drain of a corresponding transistor to an interconnect structure through a via interconnect structure.

The layout design 600B includes patterns 670, 672, 674, 676, and 678. The patterns 670, 672, 674, 676, and 678 may be configured to form via interconnect structures (e.g., VDs), hereinafter "VD 670," "VD 672," "VD 674," "VD 676," and "VD 678." Each of the VDs 670-678, except for the VD 672, may extend along a vertical direction (e.g., a direction perpendicular to the X direction and the Y direction) by a respective height in order to electrically couple a corresponding MD to an interconnect structure.

The layout design 600B includes patterns 680, 682, 684, and 686. The patterns 680, 682, 684, and 686 may be configured to form via interconnect structures (e.g., VGs), hereinafter "VG 680," "VG 682," "VG 684," and "VG 686." Each of the VGs 680-686, except for the VG 682, may extend along a vertical direction (e.g., a direction perpendicular to the X direction and the Y direction) by a respective height in order to couple a corresponding gate structure to an interconnect structure. In some embodiments, the patterns 672 and 682 may be partially overlapped with each other to form a combination of VD and VG, hereinafter "VD+VG 691." Further, the layout design 600B includes a pattern 661 overlapping respective portions of the pattern 672 and 682 to form a dielectric recess structure (hereinafter "recess 661") by filling a recessed upper portion of the VD+VG 691 with a dielectric material.

The layout design 600B includes patterns 688, 689, and 690. The patterns 688, 689, and 690 may extend along the X direction, that are configured to form interconnect structures (e.g., M0 signal tracks) over the active region 644, hereinafter "M0 track 688," "M0 track 689," and "M0 track 690," respectively. To connect the transistors 302-316 as shown in FIG. 3, some of the M0 tracks may be "cut" into a plurality of portions by one or more M0 cut patterns. For example, the M0 track 688 may be cut into M0 track portions 688-1 and 688-2 by a cut pattern 693 (hereinafter "cut M0 693"); the M0 track 690 may be cut into M0 track portions 690-1, 690-2, and 690-3 by the same cut M0 693; and a cut pattern 694 (hereinafter "cut M0 694"), respectively. In some embodiments, the cut M0s 693 and 694 may be filled or refilled with a dielectric material to electrically isolate corresponding M0 track portions from each other.

The correspondence between the layout design 600A and 600B (FIGS. 6A and 6B) and the circuit 300 (FIG. 3) can be further illustrated through the discussion of semiconductor device 700 of FIG. 7, as follows. For example, the gate structure 650 (the gate of the transistor 302) is electrically coupled to the M0 track portion 690-1 through the VD+VG 691. The gate structure 652 (the gate of the transistor 304) is electrically coupled to the M0 track portion 690-2 through the VG 684. As yet another representative example, the gate structure 654 (the gate of the transistor 308) is electrically coupled to the M0 track portion 690-3 through the VG 686. The gate structure 648 (the gate of the transistor 306) is electrically coupled to the M0 track portions 688-1 through the VG 680. Both of the portion of the active region 644 on the right-hand side of the gate structure 652 (the drain of the transistor 304) and the portion of the active region 644 on the left-hand side of the gate structure 654 (the drain of the transistor 308) are electrically coupled to the M0 track portion 688-2 through the MD 666 and VD 676. Both of the portion of the active region 604 on the right-hand side of the gate structure 616 (the drain of the transistor 314) and the portion of the active region 604 on the left-hand side of the gate structure 618 (the drain of the transistor 310) are electrically coupled to the M0 track portion 688-2 through the MD 628 and VD 640.

In some embodiments, by recessing the VD+VG 691, a connection point of the gate structure 650 can be laterally shifted from approximately where the gate structure 650 is formed to approximately where the source of the transistor 302 (on the left-hand side of the gate structure 650) is formed. The cut M0 693 can be accordingly shifted from approximately where the MD 662 is formed to approximately where the gate structure 650 is formed. As such, a lateral width of the M0 track portion 690-2 shall not be squeezed, and can be characterized with a sufficiently large landing width (e.g., equal to or greater than 1.5 times a distance between adjacent ones of the gate structures).

Referring again to FIG. 6B, the layout design 600B includes patterns 671, 673, 675, 677, and 679. The patterns 671, 673, 675, 677, and 679 may be configured to form via interconnect structures (e.g., VIA0) over the respective M0 tracks, hereinafter "VIA0 671," "VIA0 673," "VIA0 675," "VIA0 677" and "VIA0 679," respectively. Each of the VIA0s 671, 673, 675, 677, and 679 may extend along a vertical direction (e.g., a direction perpendicular to the X direction and the Y direction) by a respective height in order to electrically couple a corresponding M0 track to an interconnect structure at the next upper interconnect layer (e.g., M1 layer).

The layout design 600B includes patterns 681, 683, 685, 687, and 689'. The patterns 681, 683, 685, 687, and 689' may be configured to form interconnect structures (e.g., M1 tracks) at the next upper interconnect layer M1, hereinafter "M1 track 681," "M1 track 683," "M1 track 685," "M1 track 687" and "M1 track 689'," respectively. Each of the M1 tracks 681, 683, 685, 687, and 689' may be configured to either receive one of the inputs A1, A2, B1, and B2 (FIG. 3), or provide the output ZN (FIG. 3). For example, the M1 track 683 is configured for receiving the input B2. From the M1 track 683, through the VIA0 673, further through the M0 track 688, and then through the VG 680, the input B2 can be coupled to the gate structure 648 (the gate of the transistor 306) and the gate structure 614 (the gate of the transistor 316). In another example, the M1 track 681 is configured for receiving the input B1. From the M1 track 681 and through the VD+VG 691, the input B1 can be coupled to the gate structure 650 (the gate of the transistor 302) and the gate structure 616 (the gate of the transistor 314).

Figure 8:
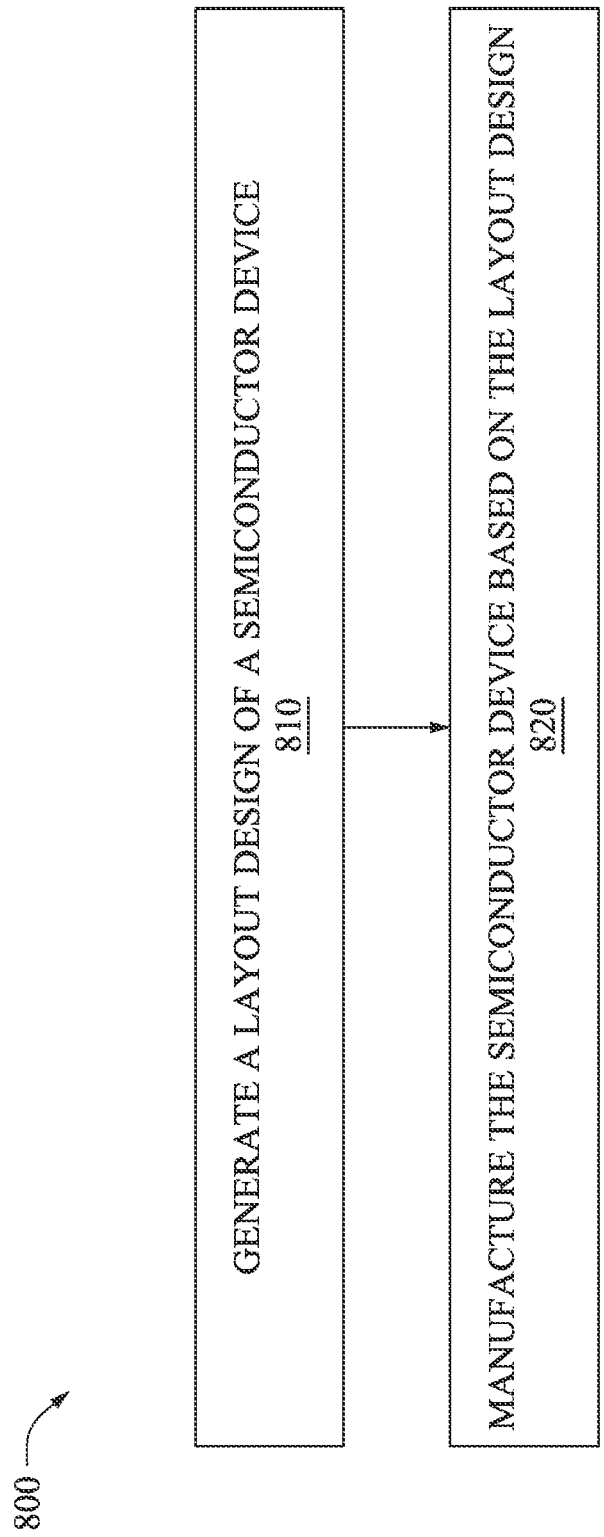
FIG. 8 illustrates a flowchart of a method of manufacturing a semiconductor device, in accordance with some embodiments.

FIG. 8 is a flowchart of a method 800 of forming or manufacturing a semiconductor device, in accordance with some embodiments. It is understood that additional operations may be performed before, during, and/or after the method 800 depicted in FIG. 8. In some embodiments, the method 800 is usable to form a semiconductor device, according to various layout designs as disclosed herein.

In operation 810 of the method 800, a layout design of a semiconductor device is generated. The operation 810 is performed by a processing device (e.g., processor 902 (FIG. 9)) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 820 of the method 800, the a semiconductor device is manufactured based on the layout design. In some embodiments, the operation 820 of the method 800 comprises manufacturing at least one mask based on the layout design, and manufacturing the a semiconductor device based on the at least one mask. A number of example manufacturing operations of the operation 820 shall be discussed with respect to the method 1100 of FIG. 11 below.

Figure 9:
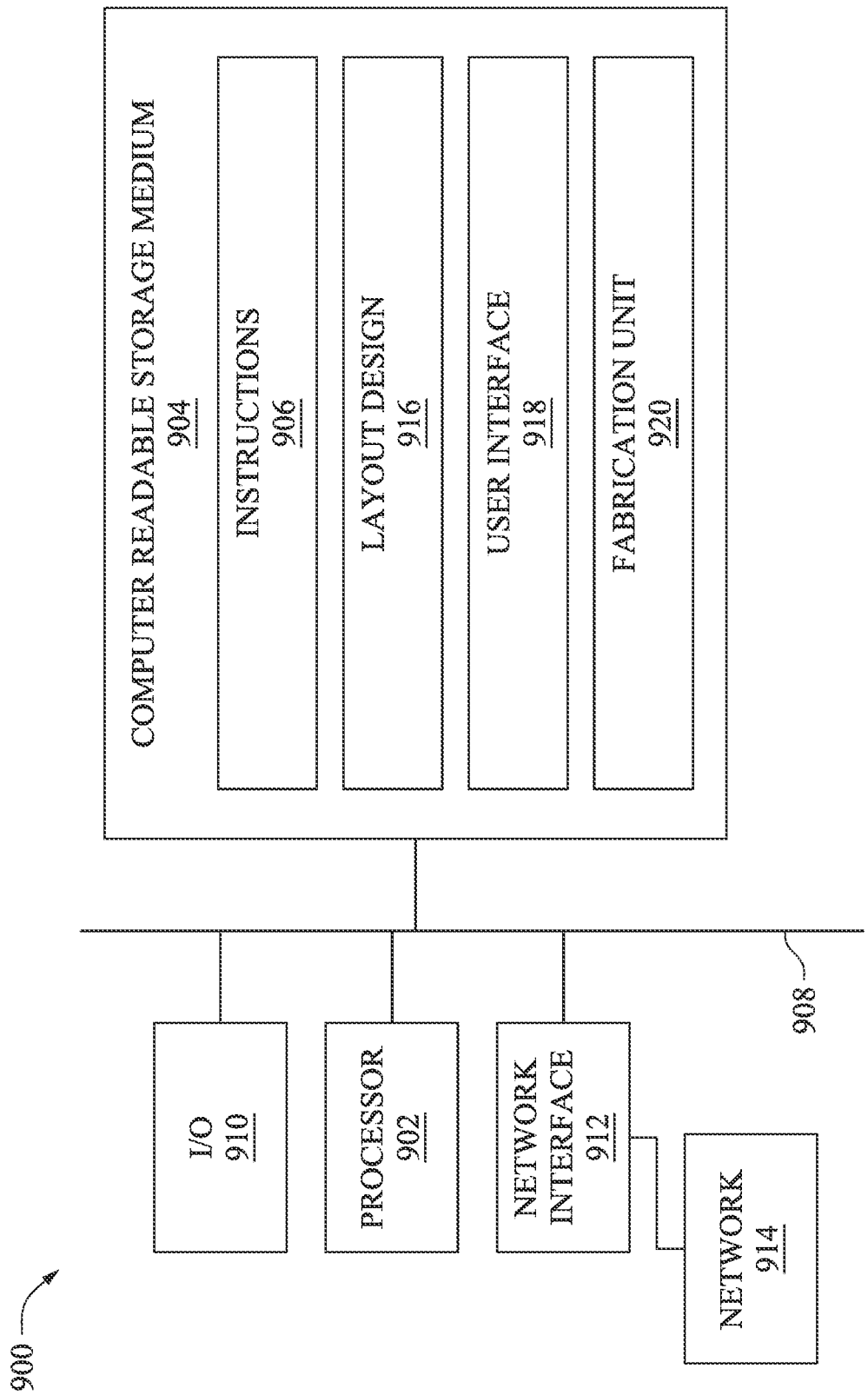
FIG. 9 illustrates a block diagram of a system of generating an IC layout design, in accordance with some embodiments.

FIG. 9 is a schematic view of a system 900 for designing and manufacturing an IC layout design, in accordance with some embodiments. System 900 generates or places one or more IC layout designs described herein. In some embodiments, the system 900 manufactures one or more semiconductor devices based on the one or more IC layout designs described herein. The system 900 includes a hardware processor 902 and a non-transitory, computer readable storage medium 904 encoded with, e.g., storing, the computer program code 906, e.g., a set of executable instructions. Computer readable storage medium 904 is configured for interfacing with manufacturing machines for producing the semiconductor device. The processor 902 is electrically coupled to the computer readable storage medium 904 by a bus 908. The processor 902 is also electrically coupled to an I/O interface 910 by bus 908. A network interface 912 is also electrically connected to the processor 902 by bus 908. Network interface 912 is connected to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described in method 800.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 904 includes a compact disk-read only memory (CD-ROM), a compact disk-read/write (CD-R/W), and/or a digital video disc (DVD).

In some embodiments, the computer readable storage medium 904 stores the computer program code 906 configured to cause system 900 to perform method 800. In some embodiments, the computer readable storage medium 904 also stores information needed for performing method 800 as well as information generated during performance of method 800, such as layout design 916, user interface 918, fabrication unit 920, and/or a set of executable instructions to perform the operation of method 800.

In some embodiments, the computer readable storage medium 904 stores instructions (e.g., computer program code 906) for interfacing with manufacturing machines. The instructions (e.g., computer program code 906) enable processor 902 to generate manufacturing instructions readable by the manufacturing machines to effectively implement method 800 during a manufacturing process.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-13154. In some embodiments, method 800 is implemented in two or more systems 900, and information such as layout design, user interface and fabrication unit are exchanged between different systems 900 by network 914.

System 900 is configured to receive information related to a layout design through I/O interface 910 or network interface 912. The information is transferred to processor 902 by bus 908 to determine a layout design for producing an IC. The layout design is then stored in computer readable storage medium 904 as layout design 916. System 900 is configured to receive information related to a user interface through I/O interface 910 or network interface 912. The information is stored in computer readable storage medium 904 as user interface 918. System 900 is configured to receive information related to a fabrication unit through I/O interface 910 or network interface 912. The information is stored in computer readable storage medium 904 as fabrication unit 920. In some embodiments, the fabrication unit 920 includes fabrication information utilized by system 900.

In some embodiments, method 800 is implemented as a standalone software application for execution by a processor. In some embodiments, method 800 is implemented as a software application that is a part of an additional software application. In some embodiments, method 800 is implemented as a plug-in to a software application. In some embodiments, method 800 is implemented as a software application that is a portion of an EDA tool. In some embodiments, method 800 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 800 is implemented by a manufacturing device to manufacture an integrated circuit using a set of masks manufactured based on one or more layout designs generated by system 900. In some embodiments, system 900 includes a manufacturing device (e.g., fabrication unit 920) to manufacture an integrated circuit using a set of masks manufactured based on one or more layout designs of the present disclosure. In some embodiments, system 900 of FIG. 9 generates layout designs of an IC that are smaller than other approaches. In some embodiments, system 900 of FIG. 9 generates layout designs of a semiconductor device that occupy less area than other approaches.

Figure 10:
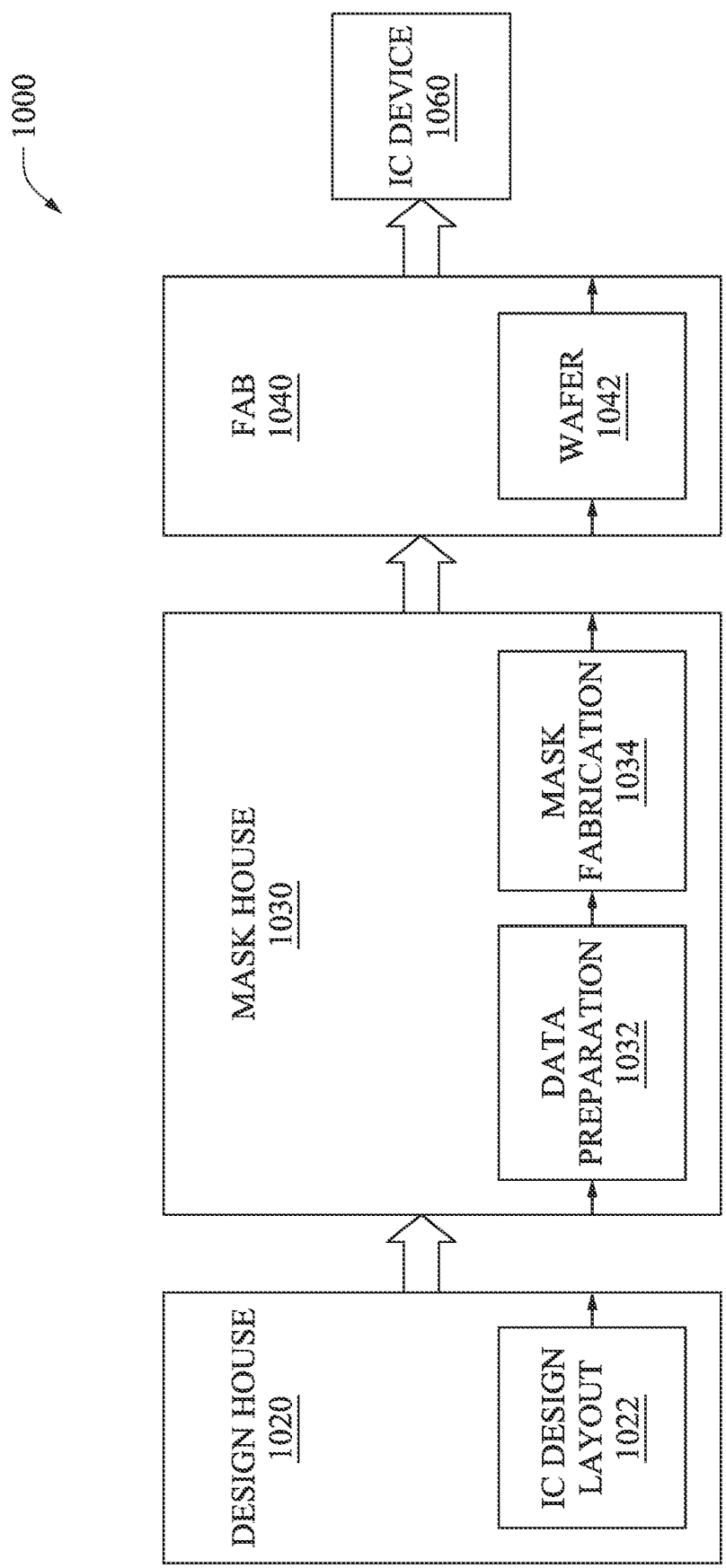
FIG. 10 illustrates a block diagram of an IC manufacturing system, and an IC manufacturing flow associated therewith, in accordance with some embodiments.

FIG. 10 is a block diagram of an integrated circuit (IC)/semiconductor device manufacturing system 1000, and an IC manufacturing flow associated therewith, in accordance with at least one embodiment of the present disclosure.

In FIG. 10, IC manufacturing system 1000 includes entities, such as a design house 1020, a mask house 1030, and an IC manufacturer/fabricator ("fab") 1040, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1040 is owned by a single company. In some embodiments, two or more of design house 1020, mask house 1030, and IC fab 1040 coexist in a common facility and use common resources.

Design house (or design team) 1020 generates an IC design layout 1022. IC design layout 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout 1022 includes various IC features, such as an active region, gate electrode, source electrode and drain electrode, metal lines or via contacts of an interlayer interconnection, and openings for bonding pads, to be formed in a semiconductor substrate (such as a silicon wafer) and various material layers disposed on the semiconductor substrate. Design house 1020 implements a proper design procedure to form IC design layout 1022. The design procedure includes one or more of logic design, physical design or place and route. IC design layout 1022 is presented in one or more data files having information of the geometrical patterns. For example, IC design layout 1022 can be expressed in a GDSII file format or DFII file format.

Mask house 1030 includes mask data preparation 1032 and mask fabrication 1034. Mask house 1030 uses IC design layout 1022 to manufacture one or more masks to be used for fabricating the various layers of IC device 1060 according to IC design layout 1022. Mask house 1030 performs mask data preparation 1032, where IC design layout 1022 is translated into a representative data file ("RDF"). Mask data preparation 1032 provides the RDF to mask fabrication 1034. Mask fabrication 1034 includes a mask writer. A mask writer converts the RDF to an image on a substrate, such as a mask (reticle) or a semiconductor wafer. The design layout is manipulated by mask data preparation 1032 to comply with particular characteristics of the mask writer and/or requirements of IC fab 1040. In FIG. 10, mask data preparation 1032 and mask fabrication 1034 are illustrated as separate elements. In some embodiments, mask data preparation 1032 and mask fabrication 1034 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1034, which may undo part of the modifications performed by OPC in order to meet mask creation rules.

In some embodiments, mask data preparation 1032 includes lithography process checking (LPC) that simulates processing that will be implemented by IC fab 1040 to fabricate IC device 1060. LPC simulates this processing based on IC design layout 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine IC design layout 1022.

It should be understood that the above description of mask data preparation 1032 has been simplified for the purposes of clarity. In some embodiments, mask data preparation 1032 includes additional features such as a logic operation (LOP) to modify the IC design layout according to manufacturing rules. Additionally, the processes applied to IC design layout 1022 during mask data preparation 1032 may be executed in a variety of different orders.

After mask data preparation 1032 and during mask fabrication 1034, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1034 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1040 is an IC fabrication entity that includes one or more manufacturing facilities for the fabrication of a variety of different IC products. In some embodiments, IC fab 1040 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1040 uses the mask (or masks) fabricated by mask house 1030 to fabricate IC device 1060. Thus, IC fab 1040 at least indirectly uses IC design layout 1022 to fabricate IC device 1060. In some embodiments, a semiconductor wafer 1042 is fabricated by IC fab 1040 using the mask (or masks) to form IC device 1060. Semiconductor wafer 1042 includes a silicon substrate or other proper substrate having material layers formed thereon. Semiconductor wafer further includes one or more of various doped regions, dielectric features, multilevel interconnects, and the like (formed at subsequent manufacturing steps).

System 1000 is shown as having design house 1020, mask house 1030 or IC fab 1040 as separate components or entities. However, it is understood that one or more of design house 1020, mask house 1030 or IC fab 1040 are part of the same component or entity.

Figure 11:
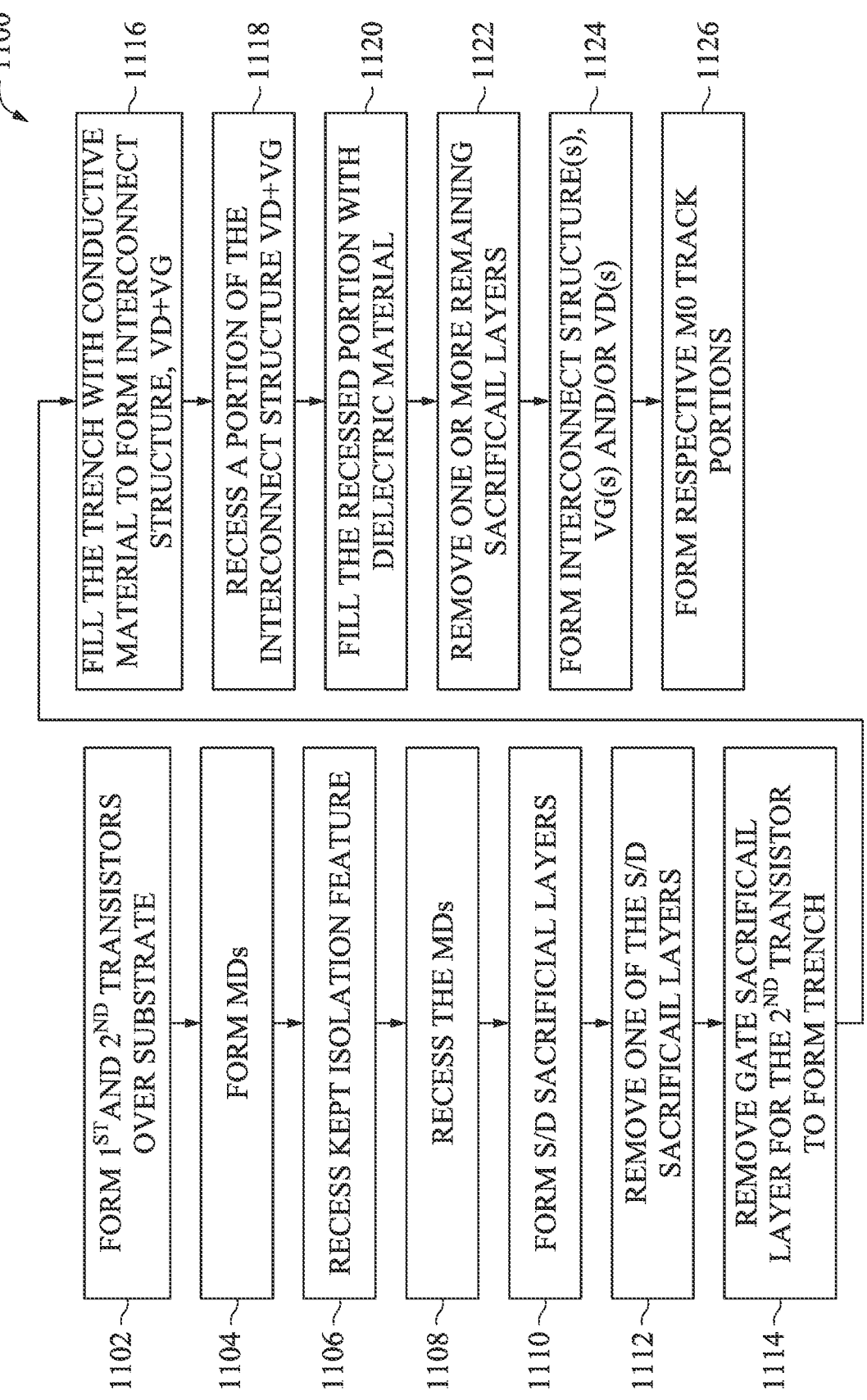
FIG. 11 illustrates a flow chart of an example method for forming a semiconductor device including a recessed interconnect structure, in accordance with some embodiments.

FIG. 11 is a flowchart illustrating a method 1100 for fabricating a semiconductor device 1200, according to various aspects of the present disclosure. The method 1100 may be part of the operation 820 of the method 800 of FIG. 8, as mentioned above. As such, the semiconductor device 1200 may be made based on at least a portion of the design layout disclosed herein. For example, the layout design 400' of FIG. 4 may be used to make the semiconductor device 1200. Thus, the semiconductor device 500 of FIG. 5 may share some substantially similar features/structures as the semiconductor device 1200.

FIGS. 12A, 12B, 12C, 12D, 12E, 12F, 12G, 12H, 12I, 12J, 12K, 12L, and 12M show schematic cross-sectional views of the semiconductor device 1200 at various stages of fabrication according to an embodiment of the method 1100 of FIG. 11. Thus, each of the operations of the method 1100 shall be discussed in conjunction with a corresponding one of the cross-sectional views of the semiconductor device 1200 shown in FIGS. 12A-12M.

The semiconductor device 1200 may be included in a microprocessor, memory cell, and/or other integrated circuit (IC). It is noted that the method of FIG. 11 does not produce a completed semiconductor device 1200. A completed semiconductor device 1200 may be fabricated using complementary metal-oxide-semiconductor (CMOS) technology processing. Accordingly, it is understood that additional operations may be provided before, during, and after the method 1100 of FIG. 11, and that some other operations may only be briefly described herein. Also, FIGS. 12A through 12M are simplified for a better understanding of the present disclosure. For example, although the figures illustrate the semiconductor device 1200, it is understood the semiconductor device 1200 may comprise a number of other devices comprising transistors, resistors, capacitors, inductors, fuses, etc.

Figure 12A:
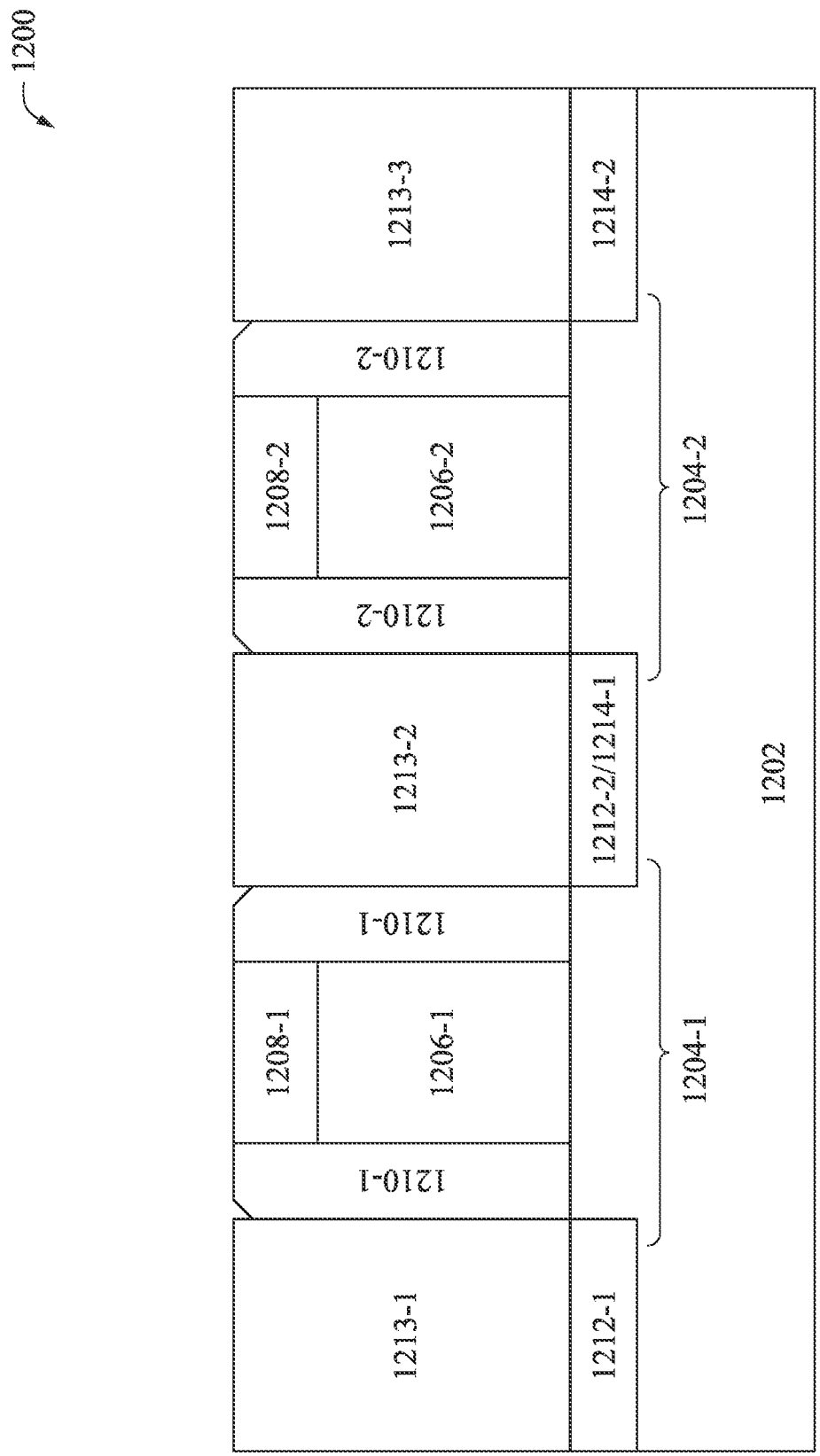
FIGS. 12A, 12B, 12C, 12D, 12E, 12F, 12G, 12H, 12I, 12J, 12K, 12L, and 12M illustrate cross-sectional views of an example semiconductor device during various fabrication stages, made by the method of FIG. 11, in accordance with some embodiments.

Referring to FIGS. 11 and 12A, the method 1100 begins at operation 1102 in which at least a first transistor 1204-1 and a second transistor 1204-2 are formed over a substrate 1202, in accordance with some embodiments. The substrate 1202 can include a crystalline silicon substrate (e.g., wafer). In some other embodiments, the substrate 1202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 1202 may include an epitaxial layer (epi-layer), may be strained for performance enhancement, and/or may include a silicon-on-insulator (SOI) structure.

The transistors 1204-1 and 1204-2 can each include one or more respective features/structures formed over and/or in the substrate 1202. For example, the transistor 1204-1 includes a gate structure 1206-1, a gate sacrificial layer 1208-1 overlaying the gate structure 1206-1, a gate spacer 1210-1 with two portions respectively disposed along the sidewalls of the gate structure 1206-1 and gate sacrificial layer 1208-1, a first source/drain structure (or region) 1212-1, and a second source/drain structure (or region) 1214-1; and the transistor 1204-2 includes a gate structure 1206-2, a gate sacrificial layer 1208-2 overlaying the gate structure 1206-2, a gate spacer 1210-2 with two portions respectively disposed along the sidewalls of the gate structure 1206-2 and gate sacrificial layer 1208-2, a first source/drain structure (or region) 1212-2, and a second source/drain structure (or region) 1214-2. The source/drain structure 1214-1 of the transistor 1204-1 and the source/drain structure 1212-2 of the transistor 1204-2 may be formed in the same region (e.g., merged with each other), in some embodiments. The transistors 1204-1 and 1204-2 are each formed as a planar MOSFET in the illustrated embodiment of FIG. 12A (and the following figures). That is, respective active regions (e.g., source/drain structures, conduction channels) of the transistors 1204-1 and 1204-2 are formed recessed from a top boundary of the substrate 1202. However, it is understood that each of the transistors 1204-1 and 1204-2 can be formed as any of various other transistor configurations (e.g., a CFET, a FinFET, a nanosheet transistor) while remaining within the scope of the present disclosure.

The gate sacrificial layers 1208-1 and 1208-2 are each formed of silicon nitride, poly-silicon, silicon oxide, the like, or a combination thereof, for example, using low-pressure chemical vapor deposition (LPCVD) or plasma enhanced chemical vapor deposition (PECVD). The gate sacrificial layers 1208-1 and 1208-2 are each used as a hard mask (sometimes referred to as a hardmask layer) during subsequent photolithography processes. The gate sacrificial layers 1208-1 and 1208-2 may be later substituted by respective interconnect structures (e.g., a VG, a portion of a VD+VG), which shall be discussed below. The gate spacers 1210-1 and 1210-2 may include silicon oxide (SiO), silicon nitride (SiN), silicon oxynitride (SiON), or other suitable material. The gate spacers 1210-1 and 1210-2 may each include a single layer or multilayer structure. In some embodiments, the gate spacer 1210-1 may be formed by depositing a blanket layer of the gate spacer 1210-1 by CVD, PVD, ALD, or other suitable technique, and performing an anisotropic etching process on the blanket layer to form a pair of the gate spacer 1210-1 respectively along the sidewalls of the gate structure 1206-1 (and the gate sacrificial layer 1208-1), as shown in the illustrated embodiment of FIG. 12A. The gate spacer 1210-2 may be formed by the similar process, as discussed above.

In some embodiments, subsequently to forming the transistors 1204-1 and 1204-2, at least some of the structures of the transistors 1204-1 and 1204-2 are overlaid (or embedded) by respective isolation structures (e.g., shallow trench isolation (STI) structures). For example, the source/drain structures 1212-1, 1214-1/1212-2, and 1214-2 can overlaid by isolation structures 1213-1, 1213-2, and 1213-3, respectively. Such an isolation structure may include a dielectric material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 12B:
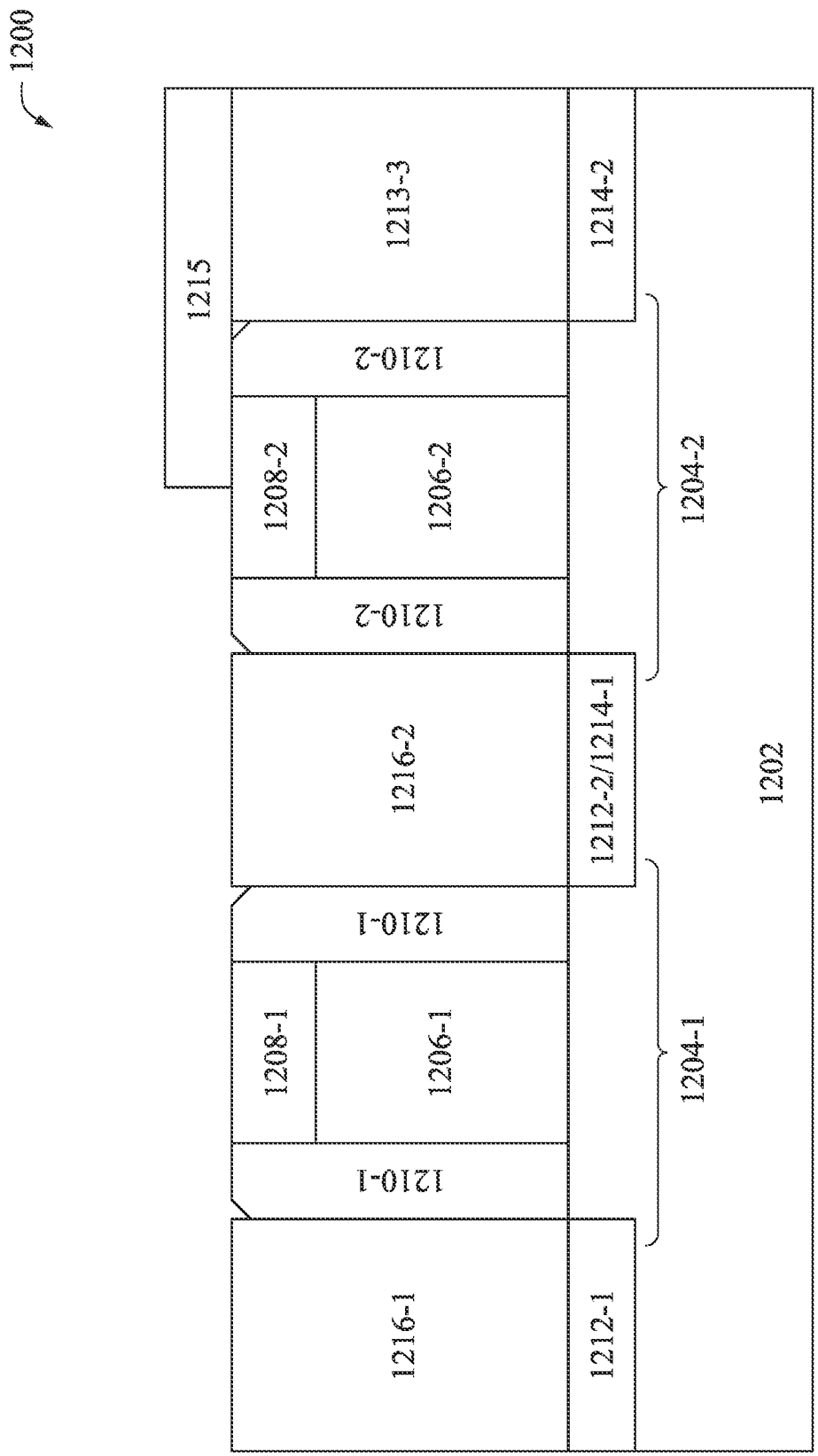

Referring to FIGS. 11 and 12B, the method 1100 proceed to operation 1104 in which MDs 1216-1 and 1216-2 are formed, in accordance with some embodiments. The MD, in contact with a formed source/drain structure, is generally configured to electrically couple the source/drain structure to an interconnect structure (e.g., an M0 track, or an M0 track portion). For example, the MD 1216-1 is in contact with the source/drain structure 1212-1 to electrically couple the source/drain structure 1212-1 to a corresponding M0 track portion, which shall be shown below. Similarly, the MD 1216-2 is in contact with the source/drain structure 1212-2/1214-1 to electrically couple the source/drain structure 1212-2/1214-1 to a corresponding M0 track portion, which shall also be shown below.

In some embodiments, the MDs 1216-1 and 1216-2 may be formed by replacing the isolation structures that overlays the corresponding source/drain structure with a conductive material. Further, the MDs 1216-1 and 1216-2 may be formed at the location where the recessed interconnect structure, as disclosed herein, is not to be formed. At the location where the recessed interconnect structure is to be formed, the isolation structure overlaying the corresponding source/drain feature may be kept at the current stage. For example, the MDs 1216-1 and 1216-2 can be formed by performing at least some of the following processes: forming a mask layer 1215 covering at least the isolation structure 1213-3 (where a recessed interconnect structure is to be formed); removing (e.g., etching), with the mask layer 1215 functioning as a mask, the isolation structures 1212-1 and 1212-2 to form holes; filling the holes with one or more conductive materials; and performing a polishing process (e.g., a chemical-mechanical polishing (CMP) process) to remove excessive conductive material and the mask layer 1215. The conductive material can include at least one material selected from the group consisting of: cobalt (Co), ruthenium (Ru), tantalum (Ta), titanium (Ti), tungsten (W), molybdenum (Mo), zinc (Zn), aluminum (Al), and manganese (Mn). Filling the holes can include one or more deposition techniques such as, for example, physical vapor deposition (PVD), chemical vapor deposition (CVD), plasma enhanced CVD (PECVD), low pressure CVD (LPCVD), atomic layer deposition (ALD), and other well-known deposition techniques.

Figure 12C:
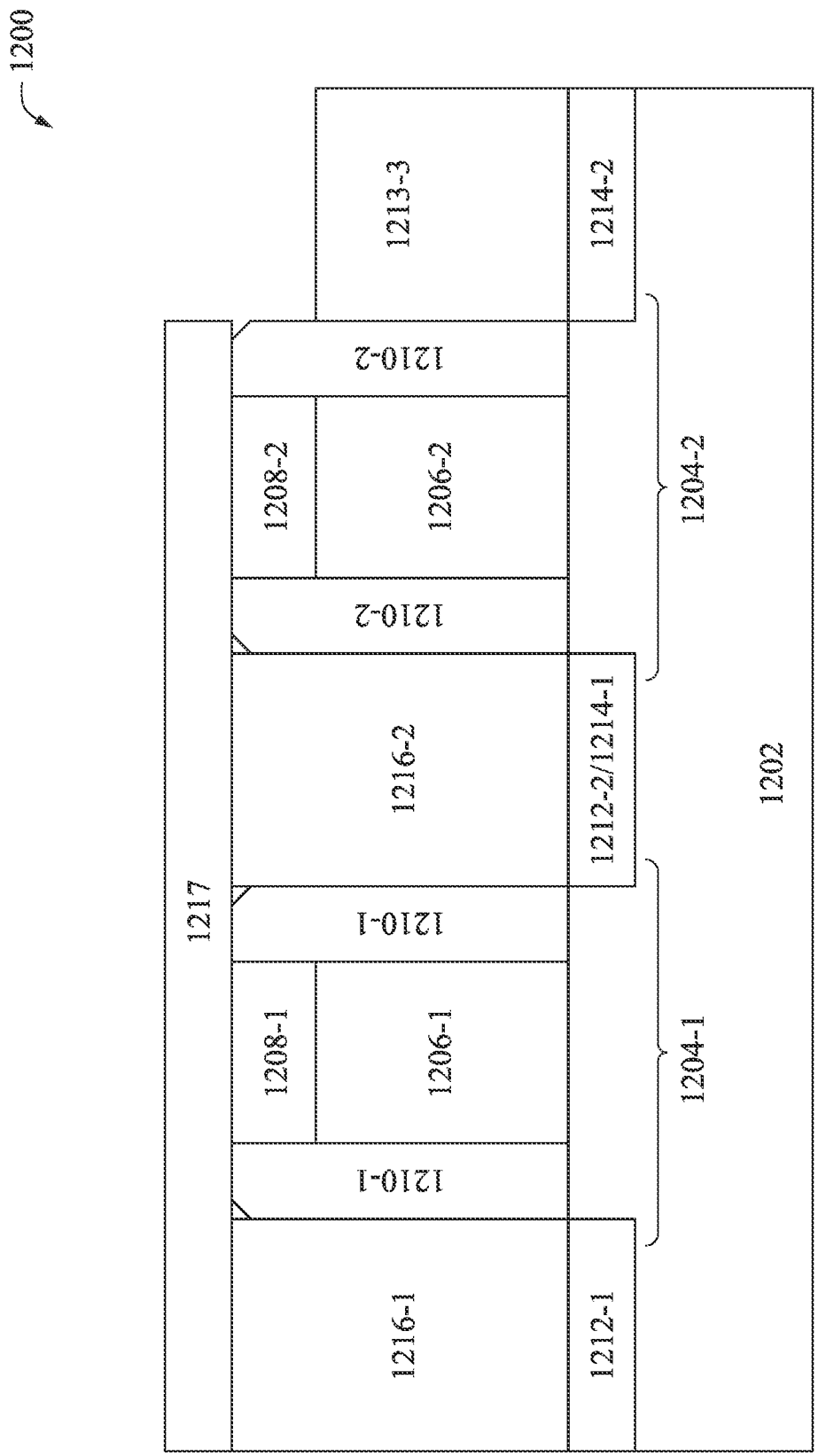

Referring to FIGS. 11 and 12C, the method 1100 proceed to operation 1106 in which an upper portion of the kept isolation structure 1213-3 is recessed, in accordance with some embodiments. In some embodiments, an upper portion of the isolation structure 1213-3 may be partially removed to have a height about the same as a height of the gate structure 1206-2. In some other embodiments, upon removing the upper portion of the isolation structure 1213-3, the height of the isolation structure 1213-3 can be lower than or higher than the height of the gate structure 1206-2. For example, the upper portion of the isolation structure 1213-3 may be removed by performing at least some of the following processes: forming a mask layer 1217 covering at least the MDs 1216-1 and 1216-2, and the gate structures 1206-1 and 1206-2; and partially removing (e.g., etching), with the mask layer 1217 functioning as a mask, the isolation structure 1213-3.

Figure 12D:
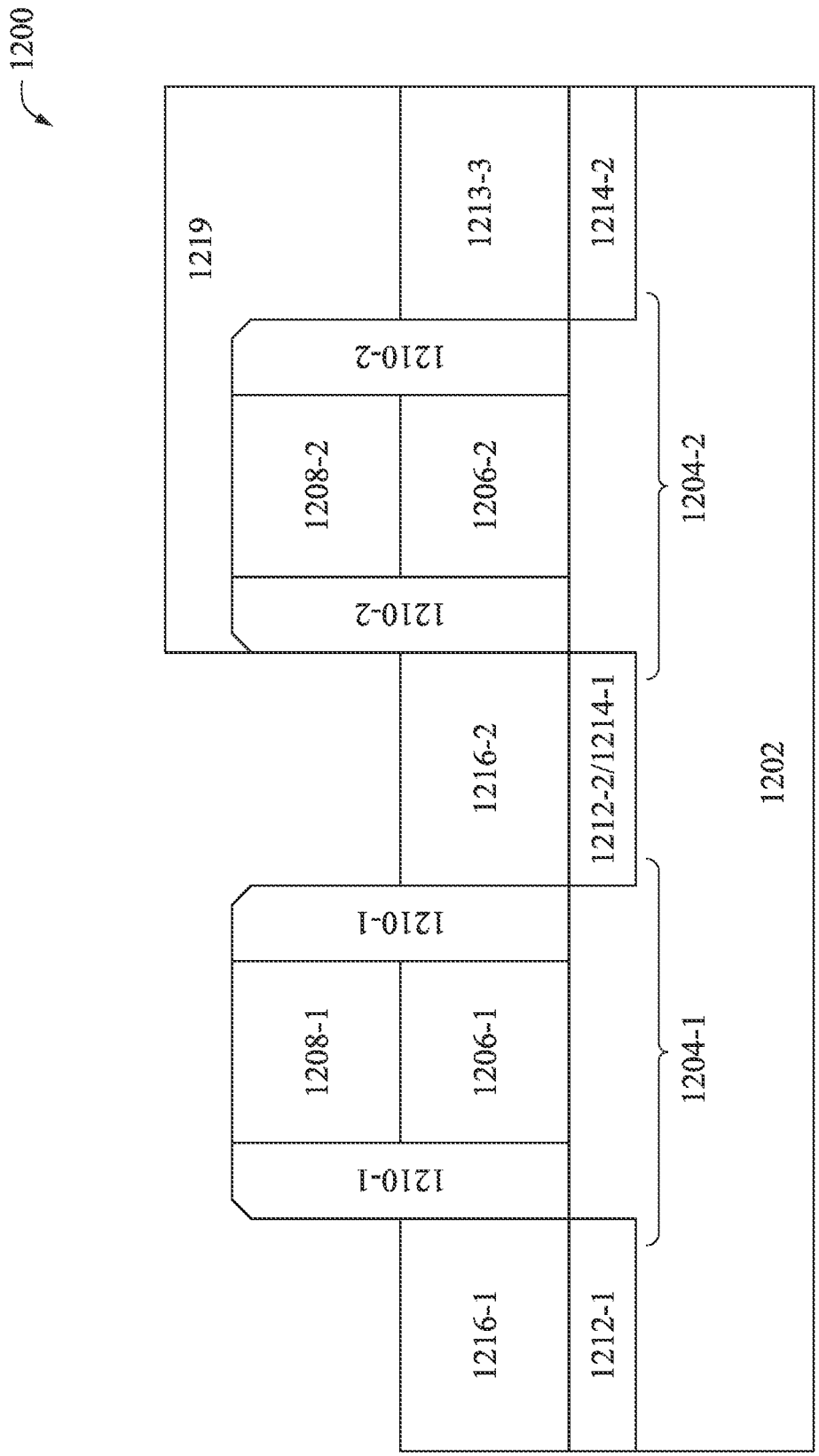

Referring to FIGS. 11 and 12D, the method 1100 proceed to operation 1108 in which the MDs 1216-1 and 1216-2 are recessed, in accordance with some embodiments. In some embodiments, respective upper portions of the MDs 1216-1 and 1216-2 may be concurrently removed. For example, the upper portions of the MDs 1216-1 and 1216-2 may be removed by performing at least some of the following processes: forming a mask layer 1219 covering at least the recessed isolation structure 1213-3, and the gate structure 1206-2; and partially removing (e.g., etching), with the mask layer 1219 functioning as a mask, the MDs 1216-1 and 1216-2.

Figure 12E:
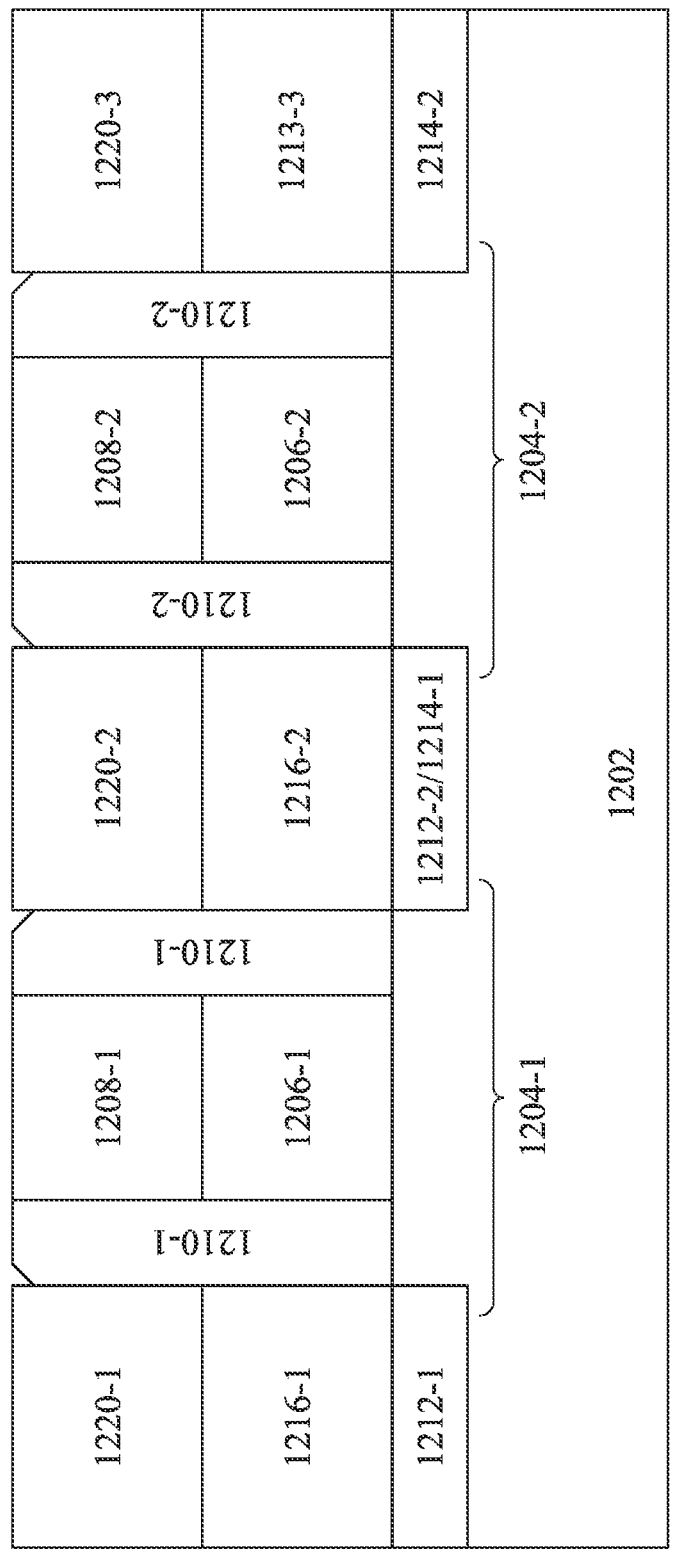

Referring to FIGS. 11 and 12E, the method 1100 proceed to operation 1110 in which source/drain sacrificial layers 1220-1, 1220-2, and 1220-3 are formed, in accordance with some embodiments. Each of the source/drain sacrificial layers 1220-1, 1220-2, and 1220-3 is formed to overlay a corresponding MD or isolation structure. For example, the source/drain sacrificial layer 1220-1 is formed to overlay the MD 1216-1; the source/drain sacrificial layer 1220-2 is formed to overlay the MD 1216-2; and the source/drain sacrificial layer 1220-3 is formed to overlay the isolation structure 1213-3. The source/drain sacrificial layers 1220-1, 1220-2, and 1220-3 are each formed of silicon nitride, poly-silicon, silicon oxide, the like, or a combination thereof, for example, using low-pressure chemical vapor deposition (LPCVD) or plasma enhanced chemical vapor deposition (PECVD). The source/drain sacrificial layers 1220-1, 1220-2, and 1220-3 are each used as a hard mask (sometimes referred to as a hardmask layer) during subsequent photolithography processes. The source/drain sacrificial layers 1220-1, 1220-2, and 1220-3 may be later substituted by respective interconnect structures (e.g., a VD, a portion of a VD+VG), which shall be discussed below. In some embodiments, the source/drain sacrificial layers 1220-1, 1220-2, and 1220-3 may have an etching rate different from an etching rate of the gate sacrificial layers 1208-1 and 1208-2.

Figure 12F:
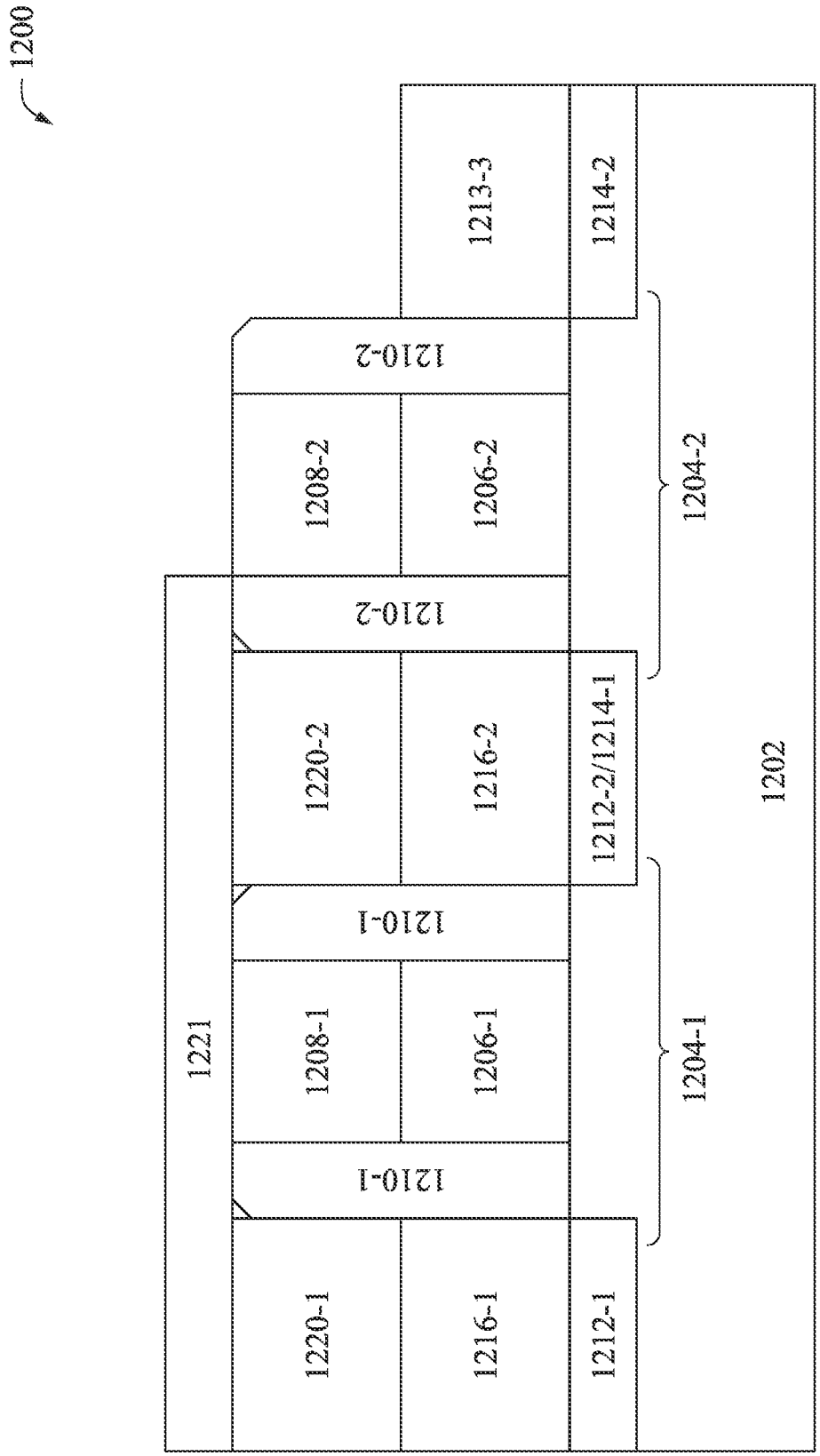

Referring to FIGS. 11 and 12F, the method 1100 proceed to operation 1112 in which one of the source/drain sacrificial layers (the source/drain sacrificial layer 1220-3) is removed, in accordance with some embodiments. In some embodiments, the method 1100 included removing a source/drain sacrificial layer formed in the location where the recessed interconnect structure is to be formed. For example, the location of the source/drain sacrificial layer 1220-3 (FIG. 12E) occupies a portion of area where the recessed interconnect structure is to be formed, and thus, the source/drain sacrificial layer 1220-3 is removed. In some embodiments, the source/drain sacrificial layer 1220-3 is removed by performing at least some of the following processes: forming a mask layer 1221 covering at least the source/drain sacrificial layer 1220-1 and 1220-2 and the gate sacrificial layer 1208-1; and removing (e.g., etching), with the mask layer 1221 functioning as a mask, the source/drain sacrificial layer 1220-3. As mentioned above, the etching rates of the gate sacrificial layer 1208-2 and the source/drain sacrificial layer 1220-3 with respect to a certain etchant are different. In an embodiment, the source/drain sacrificial layer 1220-3 may be characterized with a higher etching rate than the gate sacrificial layer 1208-2. As such, while etching the source/drain sacrificial layer 1220-3 using the mask layer 1221 that does not substantially cover the gate sacrificial layer 1208-2, the gate sacrificial layer 1208-2 may remain substantially intact.

Figure 12G:
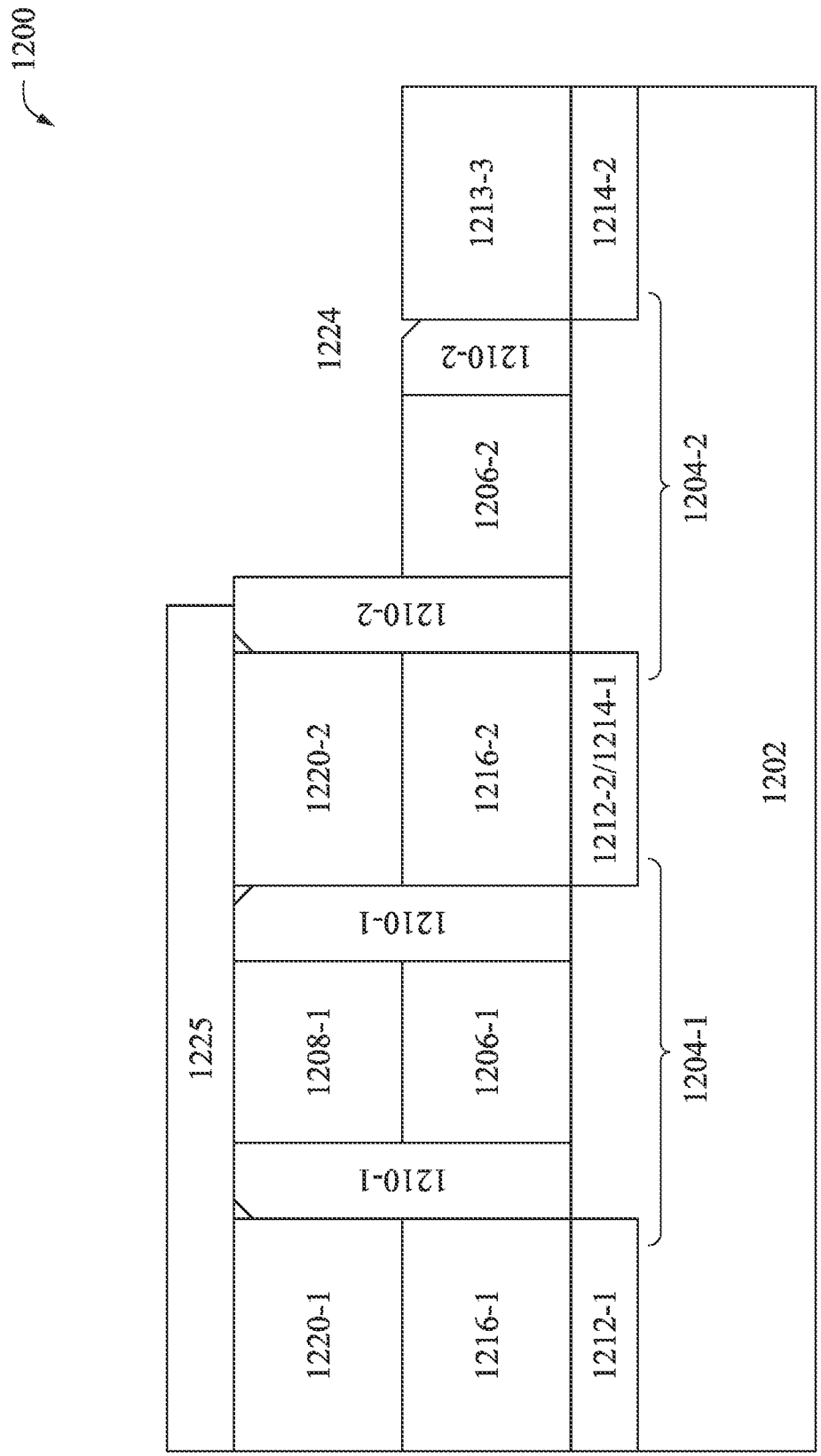

Referring to FIGS. 11 and 12G, the method 1100 proceed to operation 1114 in which the gate sacrificial layer 1208-2 for the transistor 1204-2 is removed to form a trench 1224, in accordance with some embodiments. In some embodiments, the trench 1224 may be formed by performing at least some of the following processes: forming a mask layer 1225 covering at least the source/drain sacrificial layer 1220-1 and 1220-2 and the gate sacrificial layer 1208-1; and removing (e.g., etching), with the mask layer 1225 functioning as a mask, the gate sacrificial layer 1208-2 and an upper portion of one of the pair of the gate spacer 1210-2. The mask layer 1225 can be the same as the mask layer 1221. In such a case, the gate sacrificial layer 1208-2 (FIG. 12F) and the source/drain sacrificial layer 1220-3 (FIG. 12E) may be concurrently or respectively removed using the same mask layer. In some embodiments, the mask layer 1221 (and the mask layer 1225) can include a pattern that covers at least the source/drain sacrificial layer 1220-1 and 1220-2 and the gate sacrificial layer 1208-1 but exposes the gate sacrificial layer 1208-2 and the source/drain sacrificial layer 1220-3 (FIG. 12E). In the example where the semiconductor device 1200 (or the portion of the semiconductor device 1200 shown in FIGS. 12A-M) is made based on the layout design 400', the mask layer 1221 may correspond to a combination of the patterns 452 and 460 shown in FIG. 4.

As mentioned above with respect to FIG. 12C, in some embodiments, the remained isolation structure 1213-3 may have the same height as the gate structure 1206-2. In such a case, upon removing the gate sacrificial layer 1208-2 that overlays the gate structure 1206-2 (and removing the upper portion of the gate spacer 1210-2), a top boundary of the gate structure 1206-2 and a top boundary of the remained isolation structure 1213-3 can be substantially aligned with respect to each other, which defines a substantially flat bottom boundary for the trench 1224.

Figure 12H:
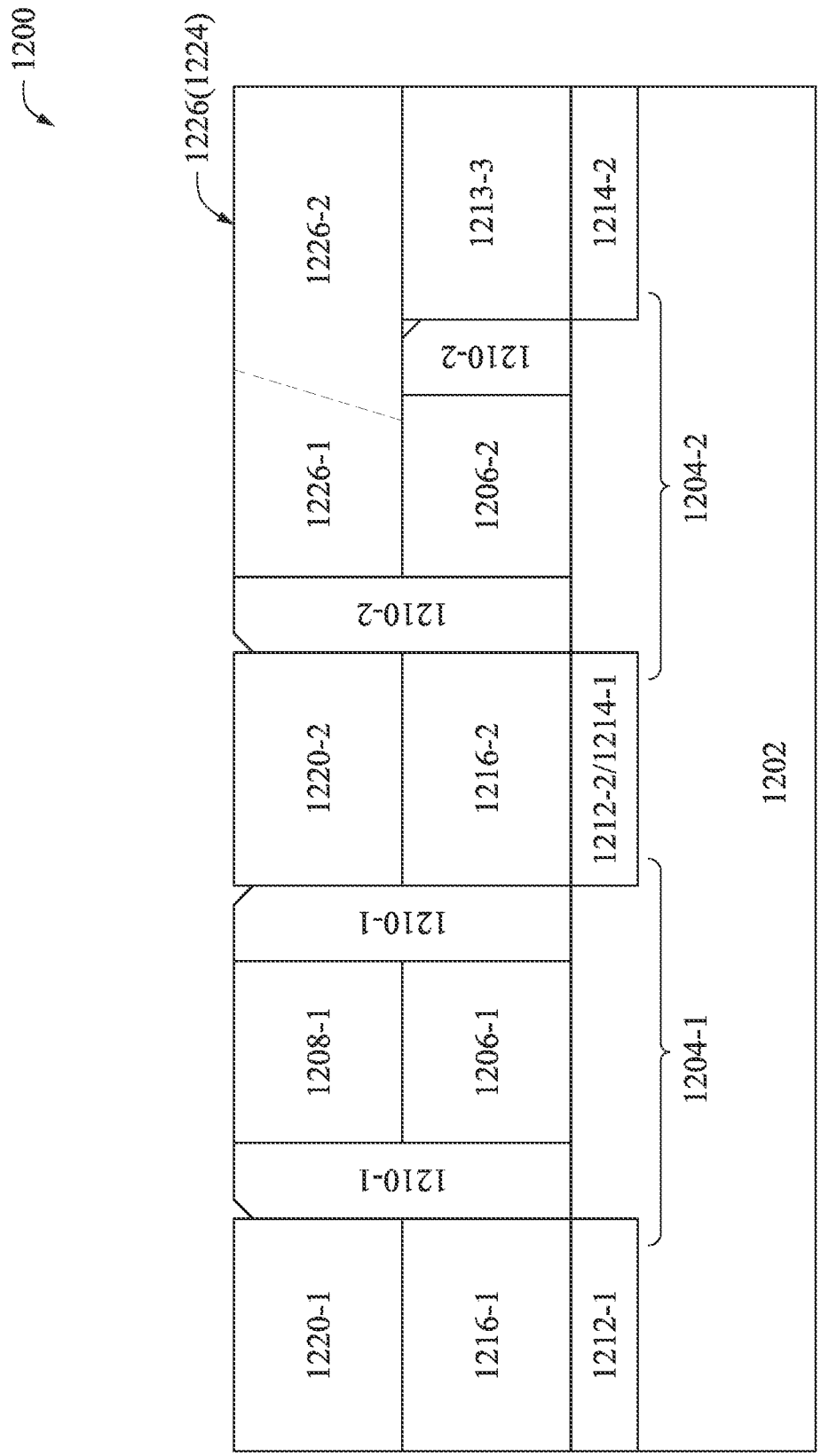
Figure 12I:
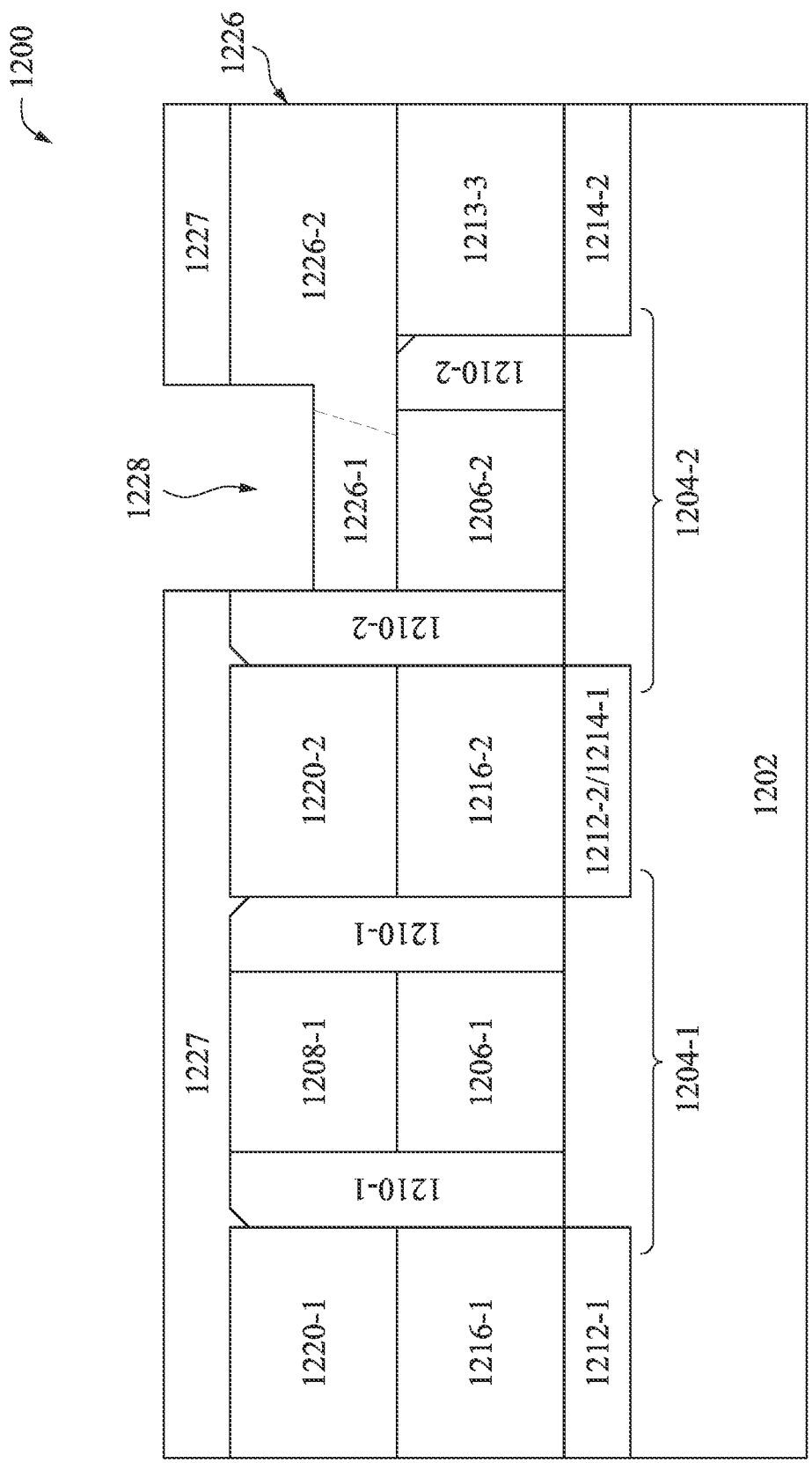

Referring to FIGS. 11 and 12H, the method 1100 proceed to operation 1116 in which the trench 1224 is filled with a conductive material to form an interconnect structure 1226, in accordance with some embodiments. As such, the interconnect structure 1226 may inherit the geometry of the trench 1224, for example, having a substantially flat bottom boundary. In some embodiments, the interconnect structure 1226 includes a first portion 1226-1, which can overlap the location of a VG that might have been formed to connect the gate structure 1206-2, and a second portion 1226-2, which can overlap the location of a VD that might have been formed to couple the source/drain structure 1214-2. Accordingly, the interconnect structure 1226 may hereinafter be referred to as "VD+VG 1226". In some embodiments, the VD+VG 1226 can be formed by performing at least some of the following processes: filling the trench 1224 with one or more conductive materials; and performing a polishing process (e.g., a CMP process) to remove excessive conductive material. The conductive material can include at least one material selected from the group consisting of: cobalt (Co), ruthenium (Ru), tantalum (Ta), titanium (Ti), tungsten (W), molybdenum (Mo), zinc (Zn), aluminum (Al), and manganese (Mn). Filling the holes can include one or more deposition techniques such as, for example, physical vapor deposition (PVD), chemical vapor deposition (CVD), plasma enhanced CVD (PECVD), low pressure CVD (LPCVD), atomic layer deposition (ALD), and other well-known deposition techniques.

Referring to FIGS. 11 and 12H, the method 1100 proceed to operation 1118 in which a portion of the VD+VG 1226 is removed to form recess 1228, in accordance with some embodiments. The recess 1228 may be vertically aligned with the gate structure 1206-2, or overlay a portion of the gate structure 1206-2 along a direction perpendicular to the direction along which the gate structure 1206-2 is extended. Specifically, the recess 1228 may be vertically aligned with the first portion 1226-1. As such, the first portion 1226-1 can have a top boundary vertically lower than a top boundary of the second portion 1226-2, and a bottom boundary directly contacting the gate structure 1206-2. Further, a bottom boundary of the second portion 1226-2 may be extended from the bottom boundary of the first portion 1226-1. In some embodiments, the recess 1228 may be formed by performing at least some of the following processes: forming a mask layer 1227 with a pattern exposing where the recess 1228 is to be formed; and removing (e.g., etching), with the mask layer 1227 functioning as a mask, a portion of the VD+VG 1226. In some embodiments, the pattern of the mask layer 1227 can partially overlap the VD+VG 1226. In the example where the semiconductor device 1200 (or the portion of the semiconductor device 1200 shown in FIGS. 12A-M) is made based on the layout design 400', the mask layer 1227 may correspond to the pattern 461 shown in FIG. 4.

Figure 12J:
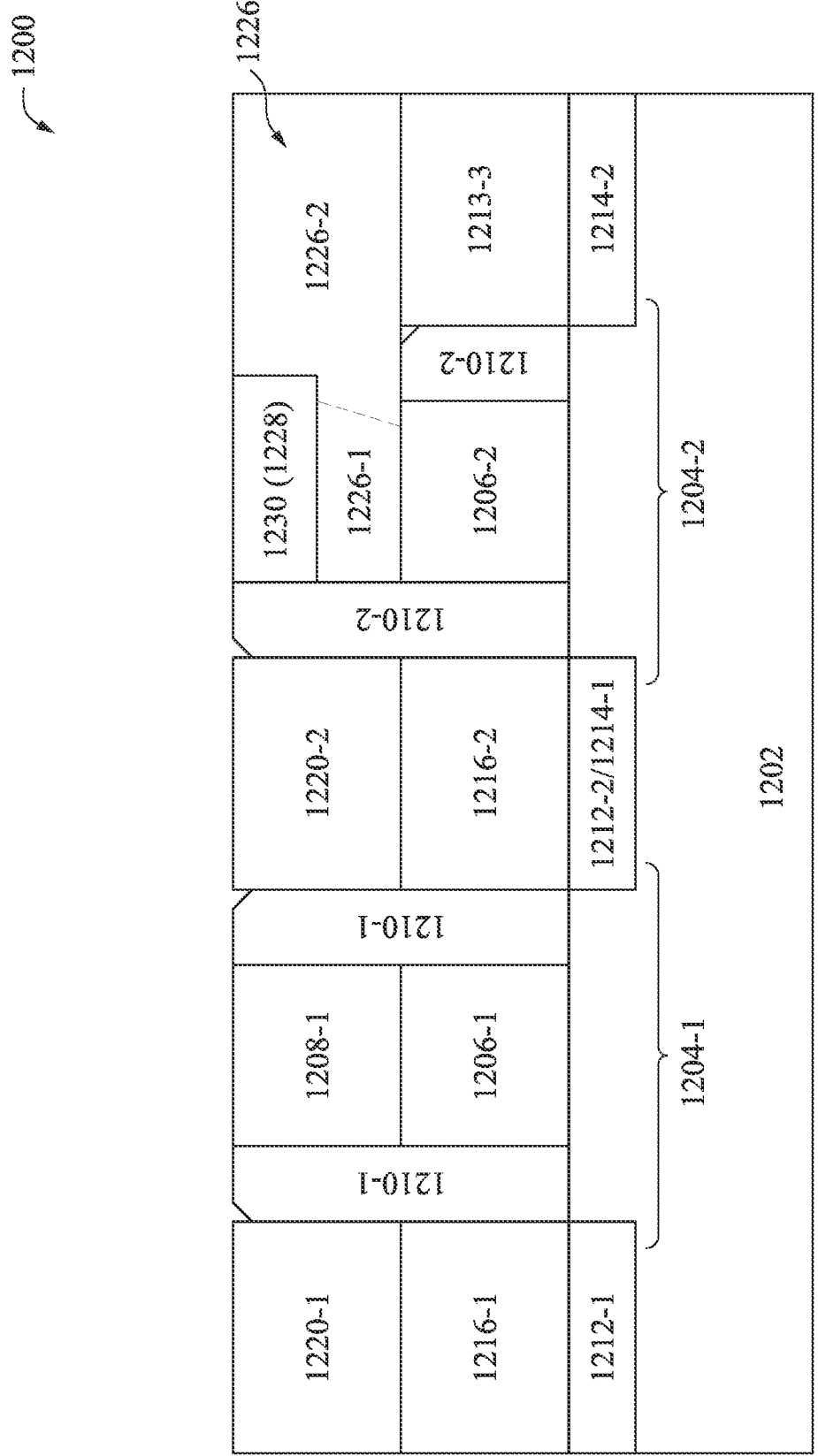

Referring to FIGS. 11 and 12J, the method 1100 proceed to operation 1120 in which the recess 1228 is filled with a dielectric material, in accordance with some embodiments. Upon filling the recess 1228 with a dielectric material, a dielectric recess structure 1230 can be formed. In some embodiments, the dielectric recess structure 1230 may be formed by performing at least some of the following processes: depositing a dielectric material over the semiconductor device 1200; and performing a polishing process (e.g., a CMP process) to remove excessive dielectric material. The dielectric material may include a material selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 12K:
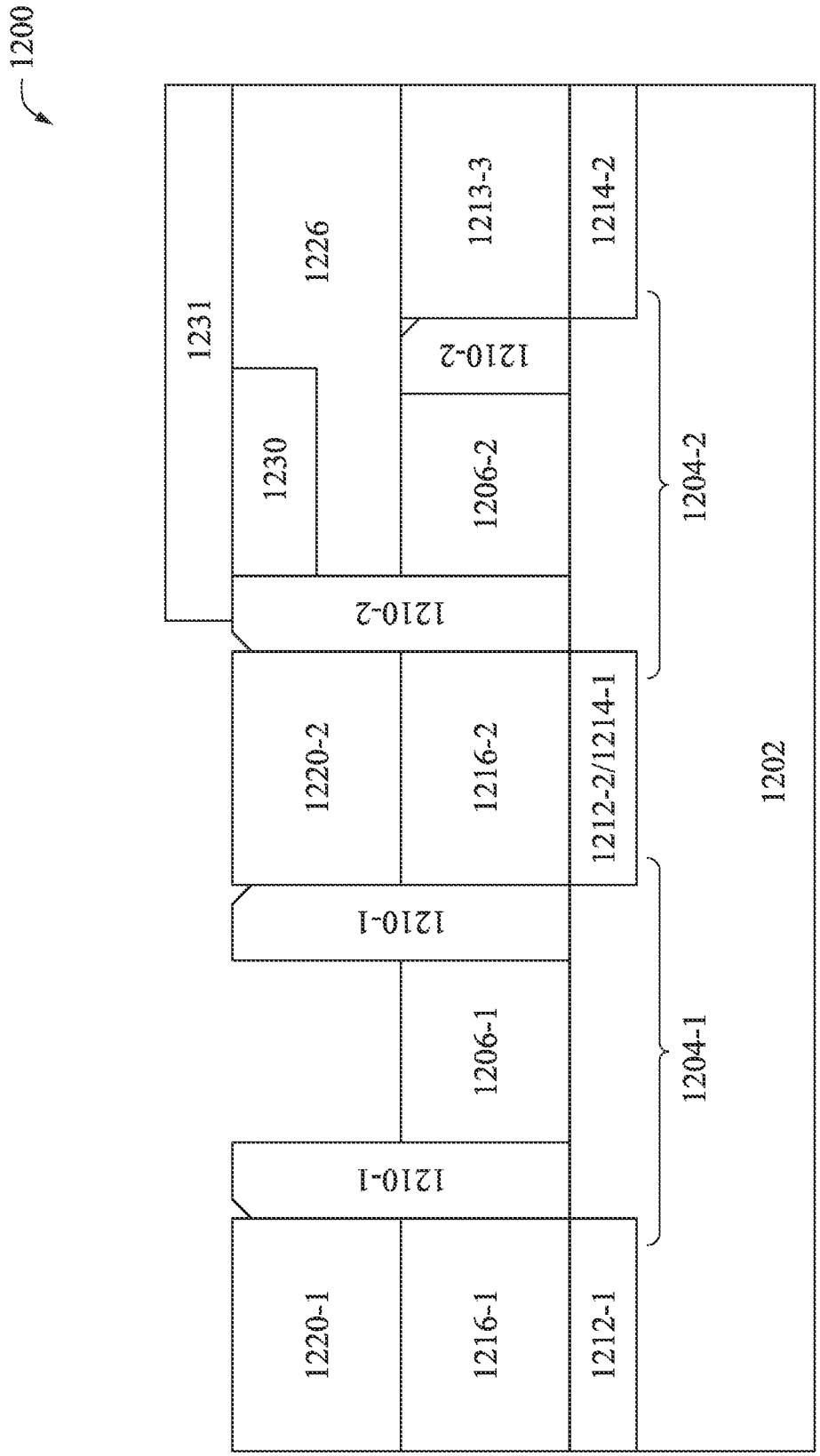

Referring to FIGS. 11 and 12K, the method 1100 proceed to operation 1122 in which one or more sacrificial layers are removed, in accordance with some embodiments. In the example where the semiconductor device 1200 (or the portion of the semiconductor device 1200 shown in FIGS. 12A-M) is made based on the layout design 400', the operation 1122 may include removing the gate sacrificial layer 1208-1 (FIG. 12J), while keeping the source/drain sacrificial layers 1220-1 and 1220-2. Upon removing the gate sacrificial layer 1208-1, the gate structure 1206-1 may be exposed. In some embodiments, the gate sacrificial layer 1208-1 may be removed by performing at least some of the following processes: forming a mask layer 1231 covering at least the recessed VD+VG 1226 and the dielectric recess structure 1230; and performing an etching process to remove the gate sacrificial layer 1208-1. In some embodiments, the etching process may selectively etch the gate sacrificial layer 1208-1, but keep the source/drain sacrificial layers 1220-1 and 1220-2 intact.

Figure 12L:
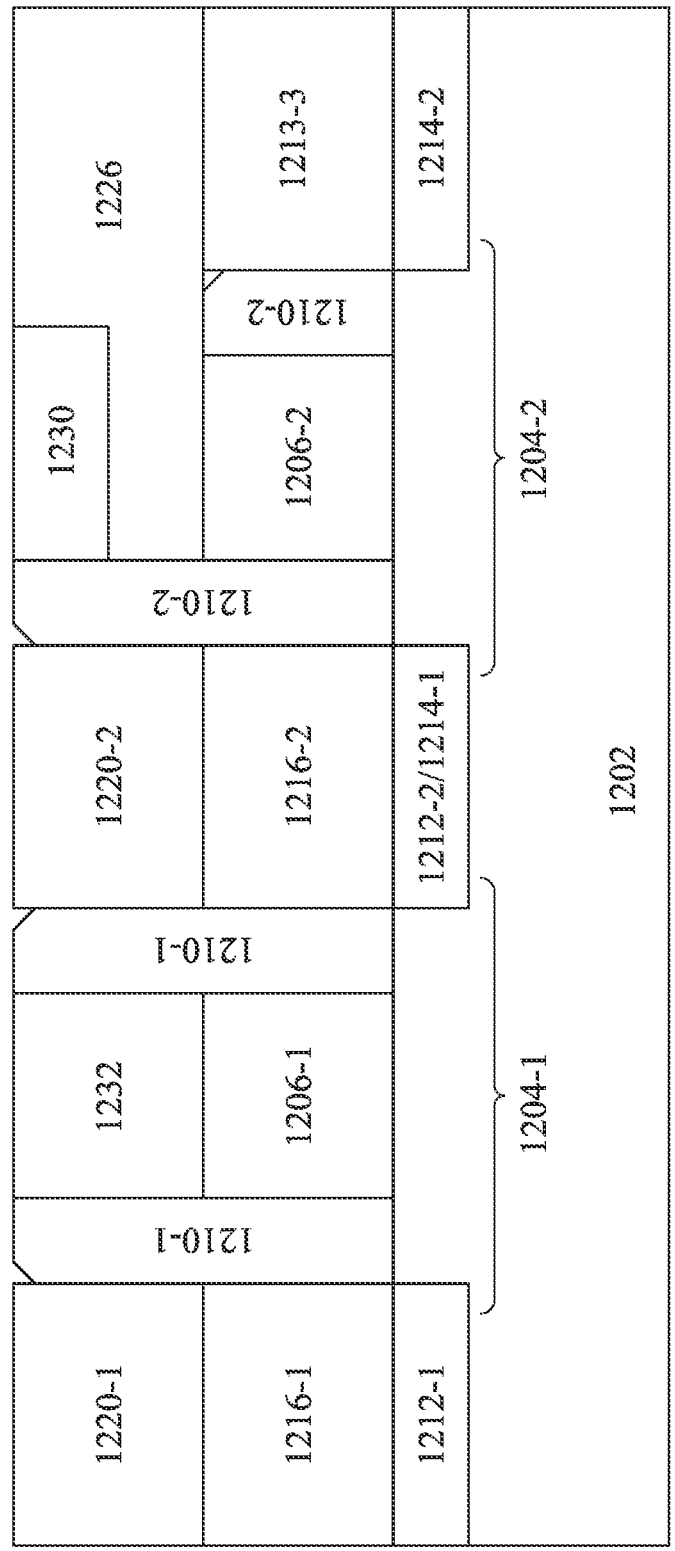

Referring to FIGS. 11 and 12L, the method 1100 proceed to operation 1124 in which one or more interconnect structures VD(s) and/or VG(s) are formed, in accordance with some embodiments. Following the above example where the semiconductor device 1200 (or the portion of the semiconductor device 1200 shown in FIGS. 12A-M) is made based on the layout design 400', the operation 1124 may include forming a VG 1232 that electrically connects the gate structure 1206-1. In some embodiments, the VG 1232 may be formed by performing at least some of the following processes: filling the hole where the gate sacrificial layer 1208-1 was formed with one or more conductive materials; and performing a polishing process (e.g., a chemical-mechanical polishing (CMP) process) to remove excessive conductive material. The conductive material can include at least one material selected from the group consisting of: cobalt (Co), ruthenium (Ru), tantalum (Ta), titanium (Ti), tungsten (W), molybdenum (Mo), zinc (Zn), aluminum (Al), and manganese (Mn). Filling the hole can include one or more deposition techniques such as, for example, physical vapor deposition (PVD), chemical vapor deposition (CVD), plasma enhanced CVD (PECVD), low pressure CVD (LPCVD), atomic layer deposition (ALD), and other well-known deposition techniques.

Figure 12M:
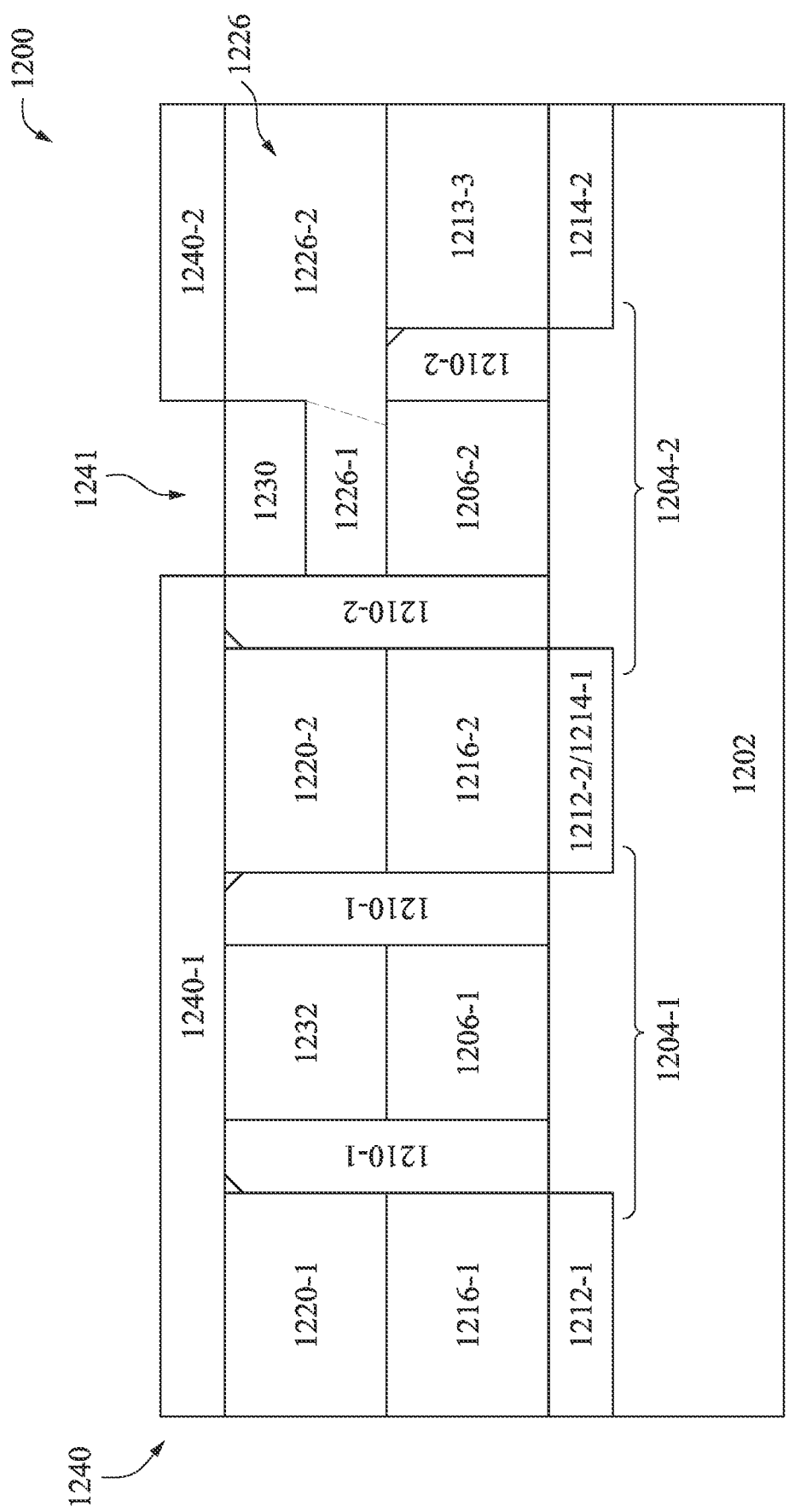

Referring to FIGS. 11 and 12M, the method 1100 proceed to operation 1126 in which respective M0 track portions 1240-1 and 1240-2 are formed, in accordance with some embodiments. The M0 track portions 1240-1 and 1240-2 may be segments of an M0 interconnect structure 1240 divided (or cut) by a cut pattern 1241. Such a cut pattern 1241 may be vertically aligned with the dielectric recess structure 1230. Following the above example where the semiconductor device 1200 (or the portion of the semiconductor device 1200 shown in FIGS. 12A-M) is made based on the layout design 400', the cut pattern 1241 may correspond to the pattern 463 shown in FIG. 4. As such, the gate structure 1206-2 can be electrically coupled to the M0 track portion 1240-2 through the recessed VD+VG 1226, while being electrically isolated from the M0 track portion 1240-1. Specifically, the recessed VD+VG 1226 can electrically connect the gate structure 1206-2 via the bottom boundary of the first portion 1226-1 and the M0 track portion 1240-2 via the top boundary of the second portion 1226-2.

In one aspect of the present disclosure, a semiconductor device is disclosed. The semiconductor device includes a first gate structure. The semiconductor device includes a first interconnect structure disposed in an interconnect layer. The interconnect layer is disposed above the first gate structure, wherein the first interconnect structure is laterally displaced from the first gate structure. The semiconductor device includes a second interconnect structure disposed between the first gate structure and the interconnect layer. The second interconnect structure includes a first portion and a second portion. The first portion and the second portion of the second interconnect structure are laterally adjacent to each other, and the first portion is vertically shorter than the second portion by a recess. The first gate structure is electrically coupled to the first interconnect structure by contacting only the first portion of the second interconnect structure to the first gate structure and contacting only the second portion of the second interconnect structure to the first interconnect structure.

In another aspect of the present disclosure, a semiconductor device is disclosed. The semiconductor device includes a first gate structure extending along a first lateral direction. The semiconductor device includes a first interconnect structure, disposed above the first gate structure, that extends along a second lateral direction perpendicular to the first lateral direction. The first interconnect structure includes a first portion and a second portion electrically isolated from each other by a first dielectric structure. The semiconductor device includes a second interconnect structure, disposed between the first gate structure and the first interconnect structure, that electrically couples the first gate structure to the first portion of the first interconnect structure. The second interconnect structure includes a recessed portion that is substantially aligned with the first gate structure and the first dielectric structure along a vertical direction.

In yet another aspect of the present disclosure, a method for manufacturing a semiconductor device is disclosed. The method includes forming a gate structure overlaid by a first sacrificial layer and a source/drain structure overlaid by a second sacrificial layer. The method includes replacing the first sacrificial layer and an upper portion of the second sacrificial layer with a first interconnect structure. The method includes recessing a portion of the first interconnect structure, wherein the recessed portion is vertically aligned with the gate structure. The method includes filling the recessed portion with a dielectric material to form a recessed dielectric structure. The method includes forming a second interconnect structure over the first interconnect structure, wherein the second interconnect structure is cut into a plurality of portions by a dielectric structure that is vertically aligned with the recessed dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first gate structure extending along a first lateral direction;
a first interconnect structure, disposed above the first gate structure, that extends along a second lateral direction perpendicular to the first lateral direction, the first interconnect structure including a first portion and a second portion electrically isolated from each other by a first dielectric structure;
a second interconnect structure, disposed between the first gate structure and the first interconnect structure, that electrically couples the first gate structure to the first portion of the first interconnect structure,
wherein the second interconnect structure includes a recessed portion that is substantially aligned with the first gate structure and the first dielectric structure along a vertical direction, and wherein the recessed portion is separated from the first portion of the first interconnect structure with a dielectric recess structure along the vertical direction.

2. The semiconductor device of claim 1, wherein the recessed portion of the second interconnect structure is directly connected to the first gate structure, and wherein the second interconnect structure further includes a non-recessed portion that is directly connected to the first portion of the first interconnect structure.

3. The semiconductor device of claim 1, further comprising:
a source/drain structure disposed on one of two sides of the first gate structure along the second lateral direction,
wherein the source/drain structure is substantially aligned with the non-recessed portion of the second interconnect structure along the vertical direction and electrically isolated from the non-recessed portion of the second interconnect structure by a second dielectric structure.

4. The semiconductor device of claim 3, further comprising:
a second gate structure disposed opposite the first gate structure from the source/drain structure along the second lateral direction,
wherein the second gate structure is electrically coupled to the second portion of the first interconnect structure through a third interconnect structure.

5. The semiconductor device of claim 4, wherein the second interconnect structure and the third interconnect structure are disposed in the same interconnect layer.

6. The semiconductor device of claim 4, wherein the first gate structure and the second gate structure are spaced apart from each other by a distance along the second lateral direction, and wherein a width by which at least the first portion or the second portion of the first interconnect structure is extended along the second lateral direction is equal to or greater than 1.5 times the distance.

7. The semiconductor device of claim 4, wherein the first gate structure and the second gate structure are adjacent ones of a number of gate structures that constitute a standard cell, the number being equal to or less than 5.

8. The semiconductor device of claim 1, wherein the first interconnect structure is included in one of a number of signal tracks disposed in an interconnect layer, the number being equal to or less than 3.

9. The semiconductor device of claim 3, further comprising:
a third gate structure disposed below the first gate structure along the vertical direction; and
a fourth interconnect structure electrically coupling the source/drain structure to a power rail disposed further below the third gate structure.

10. A semiconductor device, comprising:
a first transistor comprising:
a first gate structure extending along a first lateral direction; and
a first source/drain structure disposed next to the first gate structure along a second lateral direction;
a second transistor disposed above the first transistor and comprising:
a second gate structure extending along the first lateral direction; and
a second source/drain structure disposed next to the second gate structure along the second lateral direction;
a first interconnect structure, disposed above the second gate structure, that extends along the second lateral direction, the first interconnect structure including a first portion and a second portion electrically isolated from each other; and
a second interconnect structure, disposed between the first gate structure and the first interconnect structure, that electrically couples the first gate structure to the first portion of the first interconnect structure;
wherein the second interconnect structure includes a recessed portion that is substantially aligned with the first gate structure along a vertical direction and wherein the recessed portion is separated from the first portion of the first interconnect structure with a dielectric recess structure along the vertical direction.

11. The semiconductor device of claim 10, wherein the recessed portion of the second interconnect structure is directly connected to the first gate structure.

12. The semiconductor device of claim 10, wherein the second interconnect structure further includes a non-recessed portion that is directly connected to the first portion of the first interconnect structure.

13. The semiconductor device of claim 10, wherein the first source/drain structure, the second source/drain structure, and the non-recessed portion of the second interconnect structure are substantially aligned with one another along the vertical direction.

14. The semiconductor device of claim 10, wherein the first transistor has a first conductive type, and the second transistor has a second conductive type opposite to the first conductive type.

15. The semiconductor device of claim 10, wherein each of the first gate structure and the second gate structure is one of a number of gate structures that constitute a standard cell, the number being equal to or less than 5.

16. The semiconductor device of claim 10, wherein the first interconnect structure is included in one of a number of signal tracks disposed in an interconnect layer, the number being equal to or less than 3.

17. The semiconductor device of claim 10, further comprising:
a third interconnect structure extending along the vertical direction to electrically couple the second source/drain structure to a power rail disposed below the first source/drain structure;
wherein the power rail is configured to deliver a supply voltage.

18. The semiconductor device of claim 10, wherein the first transistor and second transistor collectively form a complementary field-effect transistor.

19. A semiconductor device, comprising:
a first transistor having a first conductive type and comprising:
a first gate structure extending along a first lateral direction; and
a first source/drain structure disposed next to the first gate structure along a second lateral direction;
a second transistor having a second conductive type opposite to the first conductive type, disposed above the first transistor, and comprising:
a second gate structure extending along the first lateral direction; and
a second source/drain structure disposed next to the second gate structure along the second lateral direction;
a first interconnect structure disposed in an interconnect layer above the second gate structure;
a second interconnect structure also disposed in the same interconnect layer, wherein the second interconnect structure is spaced apart from the first interconnect structure along the second lateral direction; and a third interconnect structure electrically connecting the first gate structure to the first interconnect structure;

wherein the third interconnect structure comprises a first portion and a second portion;

wherein the first portion is in physical contact only with the second gate structure and the second portion is in physical contact only with the first interconnect structure.

20. The semiconductor device of claim 19, wherein the first portion is shorter than the second portion, with respective bottom boundaries of the first and second portions substantially aligned with each other.

* * * * *